US011194950B2

(12) United States Patent
Agarwal et al.

(10) Patent No.: US 11,194,950 B2
(45) Date of Patent: *Dec. 7, 2021

(54) NETWORK-ON-CHIP TOPOLOGY GENERATION

(71) Applicant: Arm Limited, Cambridge (GB)

(72) Inventors: Nitin Kumar Agarwal, Bangalore (IN); Anup Gangwar, Austin, TX (US); Honnahuggi Harinath Venkata Naga Ambica Prasad, Bangalore (IN); Ravishankar Sreedharan, Bangalore (IN); Narayana Sri Harsha Gade, Bangalore (IN)

(73) Assignee: Arm Limited, Cambridge (GB)

(*) Notice: Subject to any disclaimer, the term of this patent is extended or adjusted under 35 U.S.C. 154(b) by 0 days.

This patent is subject to a terminal disclaimer.

(21) Appl. No.: 17/076,403

(22) Filed: Oct. 21, 2020

(65) Prior Publication Data

US 2021/0036967 A1     Feb. 4, 2021

Related U.S. Application Data

(63) Continuation-in-part of application No. 16/518,254, filed on Jul. 22, 2019, now Pat. No. 10,817,627.

(51) Int. Cl.
*G06F 30/00* (2020.01)
*G06F 30/394* (2020.01)
*H04L 12/933* (2013.01)
*G06F 15/78* (2006.01)
*H04L 12/861* (2013.01)
(Continued)

(52) U.S. Cl.
CPC ........ *G06F 30/394* (2020.01); *G06F 15/7825* (2013.01); *H04L 12/4641* (2013.01); *H04L 41/12* (2013.01); *H04L 47/24* (2013.01); *H04L 49/109* (2013.01); *H04L 49/90* (2013.01)

(58) Field of Classification Search
CPC . G06F 30/394; G06F 15/7825; H04L 49/109; H04L 49/90; H04L 12/4641; H04L 47/24; H04L 41/12
See application file for complete search history.

(56) References Cited

U.S. PATENT DOCUMENTS 9,444,702 B1 * 9/2016 Raponi ................. H04L 43/045
10,318,243 B2 * 6/2019 Gangwar ................ H04L 49/40
(Continued)

*Primary Examiner* — Naum Levin
(74) *Attorney, Agent, or Firm* — Leveque Intellectual Property Law, PC

(57) ABSTRACT

The present disclosure provides a computer-based method and system for synthesizing a NoC. Physical data, device data, bridge data and traffic data are determined based on an input specification for the NoC. A virtual channel (VC) is assigned to each traffic flow. A head of line (HoL) conflict graph (HCG) is constructed based on the traffic data and the VC assignments. The HGC is modified based on bridge data and the traffic data to generate a modified HCG. A plurality of traffic graphs (TGs) are constructed based on the physical data, the bridge data, the traffic data and the modified HCG. A candidate topology is generated for each TG, which includes the bridge ports, routers and connections. The candidate topologies are merged to create a merged candidate topology, and the routers within the merged candidate topology are merged to generate a final topology for the NoC.

20 Claims, 31 Drawing Sheets

(51) Int. Cl.
*H04L 12/46* (2006.01)
*H04L 12/851* (2013.01)
*H04L 12/24* (2006.01)

(56) References Cited

U.S. PATENT DOCUMENTS

| | | | |
|---|---|---|---|
| 10,484,267 B2 * | 11/2019 | Gerstel | H04L 41/0668 |
| 10,817,627 B1 * | 10/2020 | Agarwal | G06F 30/394 |
| 2021/0058289 A1 * | 2/2021 | Gangwar | G06F 15/7825 |
| 2021/0160194 A1 * | 5/2021 | Prasad | H04L 43/0894 |
| 2021/0168038 A1 * | 6/2021 | Gade | H04L 41/12 |

* cited by examiner

NETWORK-ON-CHIP TOPOLOGY GENERATION

CROSS-REFERENCE TO RELATED APPLICATIONS

This application is a continuation-in-part (CIP) of U.S. patent application Ser. No. 16/518,254 (filed on Jul. 22, 2019 and issued as U.S. Pat. No. 10,817,627 on Oct. 27, 2020), the disclosure of which is incorporated herein by reference in its entirety.

BACKGROUND

The present disclosure relates to a network. More particularly, the present disclosure relates to a Network-on-Chip (NoC).

A NoC is a network-based communication subsystem implemented on an integrated circuit (IC), such as a System-on-Chip (SoC), that enables IC modules to exchange data more effectively than conventional bus or crossbar architectures. More particularly, a NoC is a router-based packet switching network that connects IC modules, such as intellectual property (IP) cores. A NoC includes various components, such as routers, resizers or serializers/deserializers (SerDes's), physical clock domain crossing (PCDC) buffers, pipeline elements, etc. NoC synthesis is a process that lays out and configures NoC components on the IC based on a NoC input specification. Generally, the NoC design must accommodate the data or traffic communicated between IC modules while satisfying various design constraints, such as power, performance and area (PPA), wiring cost, etc., that may conflict with one another.

NoC synthesis includes, inter alia, generating the topology for the NoC, which is the arrangement of routers, connections, and traffic paths or routes between IC modules. A poorly-designed NoC topology can significantly impact the NoC's PPA, wiring cost, etc., and may create Head-of-Line (HoL) blocking across classes of traffic. HoL blocking occurs when a sequence of packets from one traffic class is blocked by a packet from another traffic class even though the route for the blocked traffic class is clear. HoL blocking across traffic classes reduce NoC performance.

The NoC topology specifies the number of wires that are needed to physically connect or link each pair of devices. Unfortunately, wiring congestion due to large link sizes may prevent the subsequent placement and routing (P&R) of the NoC components.

DETAILED DESCRIPTION

Figure 1:
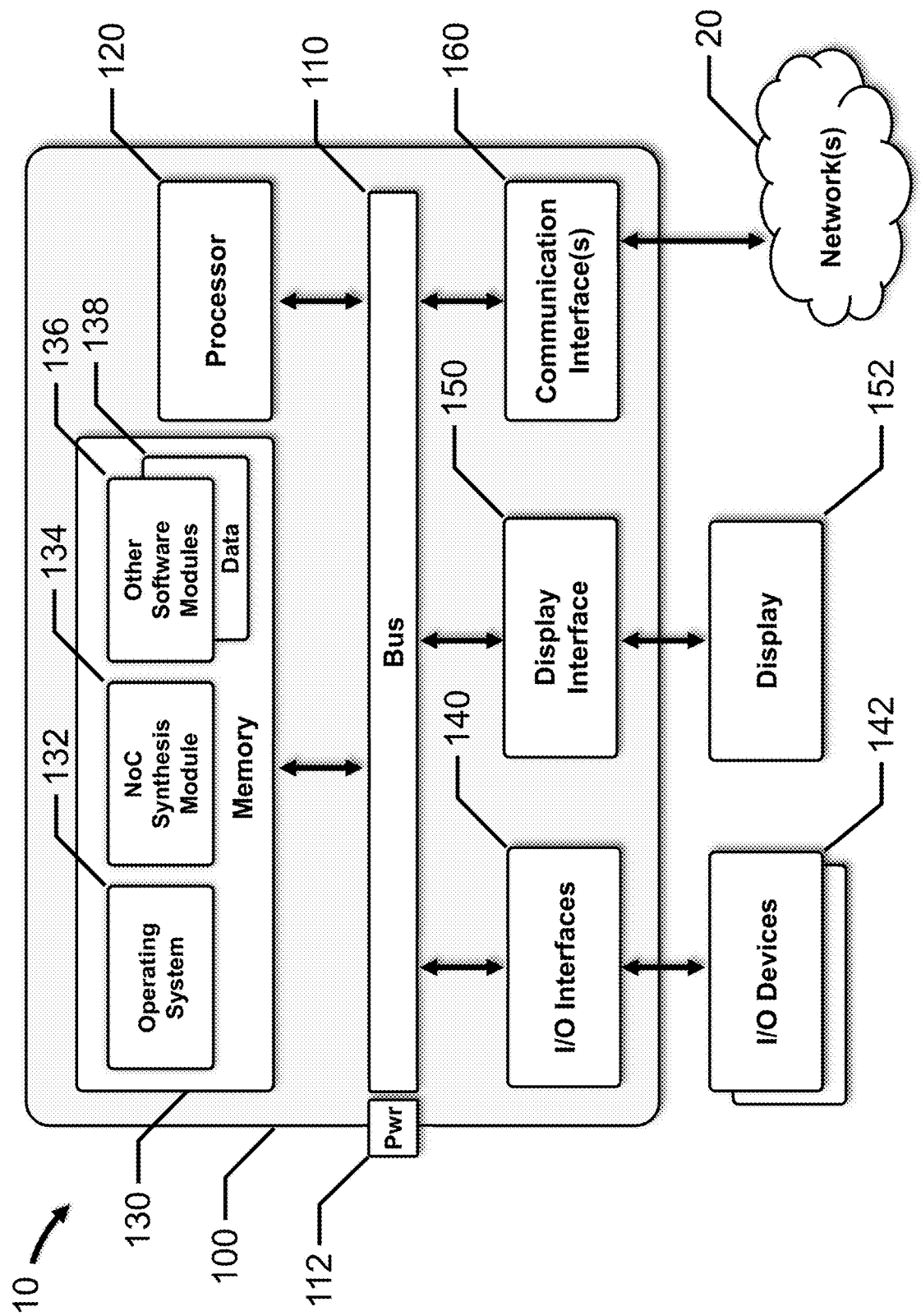
FIG. 1 depicts a block diagram of a NoC synthesis system, in accordance with an embodiment of the present disclosure.

Embodiments of the present disclosure will now be described with reference to the drawing figures, in which like reference numerals refer to like parts throughout.

Embodiments of the present disclosure advantageously provide a computer-based method and system for synthesizing a Network-on-Chip (NoC). More particularly, embodiments of the present disclosure advantageously provide a NoC topology that balances compactness, such as, for example, the number of routers, with appropriate traffic isolation to avoid HoL traffic conflicts, while accommodating link size constraints, in a cost-effective manner.

In one embodiment, physical data, device data, bridge data and traffic data are determined based on an input specification for the NoC. The bridge data include a plurality of bridge ports, and the traffic data include a plurality of traffic flows. A virtual channel (VC) is assigned to each traffic flow to create a plurality of VC assignments. An HCG is constructed based on the traffic data and the VC assignments. The HGC is modified based on bridge data and the traffic data to generate a modified HCG. A plurality of traffic graphs (TGs) are constructed based on the physical data, the bridge data, the traffic data and the modified HCG. A candidate topology is generated for each TG. The candidate topology includes the plurality of bridge ports, a plurality of routers and a plurality of connections. The candidate topologies are merged to create a merged candidate topology, and the routers within the merged candidate topology are merged to generate a final topology for the NoC.

FIG. 1 depicts a block diagram of NoC synthesis system 10, in accordance with an embodiment of the present disclosure.

Computer 100 includes bus 110, processor 120, storage element or memory 130, I/O interfaces 140, display interface 150, and one or more communication interfaces 160. Generally, I/O interfaces 140 are coupled to I/O devices 142 using a wired or wireless connection, display interface 150 is coupled to display 152, and communication interface 160 is connected to network 20 using a wired or wireless connection.

Bus 110 is a communication system that transfers data between processor 120, memory 130, I/O interfaces 140, display interface 150, and communication interface 160, as well as other components not depicted in FIG. 1. Power connector 112 is coupled to bus 110 and a power supply (not shown).

Processor 120 includes one or more general-purpose or application-specific microprocessors that executes instructions to perform control, computation, input/output, etc. functions for computer 100. Processor 120 may include a single integrated circuit, such as a micro-processing device, or multiple integrated circuit devices and/or circuit boards working in cooperation to accomplish the functions of processor 120. In addition, processor 120 may execute computer programs or modules, such as operating system 132, NoC synthesis module 134, other software modules 136, etc., stored within memory 130.

Generally, memory 130 stores instructions for execution by processor 120 and data. Memory 130 may include a variety of non-transitory computer-readable medium that may be accessed by processor 120. In various embodiments, memory 130 may include volatile and nonvolatile medium, non-removable medium and/or removable medium. For example, memory 130 may include any combination of random access memory (RAM), dynamic RAM (DRAM), static RAM (SRAM), read only memory (ROM), flash memory, cache memory, and/or any other type of non-transitory computer-readable medium.

Memory 130 contains various components for retrieving, presenting, modifying, and storing data. For example, memory 130 stores software modules that provide functionality when executed by processor 120. The software modules include operating system 132 that provides operating system functionality for computer 100. The software modules also include NoC synthesis module 134 that provides functionality for synthesizing the NoC architecture. In certain embodiments, NoC synthesis module 134 may include a plurality of modules, each module providing specific individual functionality for synthesizing the NoC architecture, such as, for example, an input module, a VC module, a topology module, a routing module, a network generation module, a PCDC module, a link size and resizer module, a pipeline and timing component module, an output module, etc. Other software modules 136 may cooperate with NoC synthesis module 134 to provide functionality for synthesizing the NoC architecture.

Data 138 may include data associated with operating system 132, NoC synthesis module 134, other software modules 136, etc.

I/O interfaces 140 are configured to transmit and/or receive data from I/O devices 142. I/O interfaces 140 enable connectivity between processor 120 and I/O devices 142 by encoding data to be sent from processor 120 to I/O devices 142, and decoding data received from I/O devices 142 for processor 120. Generally, data may be sent over wired and/or wireless connections. For example, I/O interfaces 140 may include one or more wired communications interfaces, such as USB, Ethernet, etc., and/or one or more wireless communications interfaces, coupled to one or more antennas, such as WiFi, Bluetooth, cellular, etc.

Generally, I/O devices 142 provide input to computer 100 and/or output from computer 100. As discussed above, I/O devices 142 are operably connected to computer 100 using a wired and/or wireless connection. I/O devices 142 may include a local processor coupled to a communication interface that is configured to communicate with computer 100 using the wired and/or wireless connection. For example, I/O devices 142 may include a keyboard, mouse, touch pad, joystick, etc.

Display interface 150 is configured to transmit image data from computer 100 to monitor or display 152.

Communication interface 160 is configured to transmit data to and from network 20 using one or more wired and/or wireless connections. Network 20 may include one or more local area networks, wide area networks, the Internet, etc., which may execute various network protocols, such as, for example, wired and/or wireless Ethernet, Bluetooth, etc. Network 20 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Figure 2:
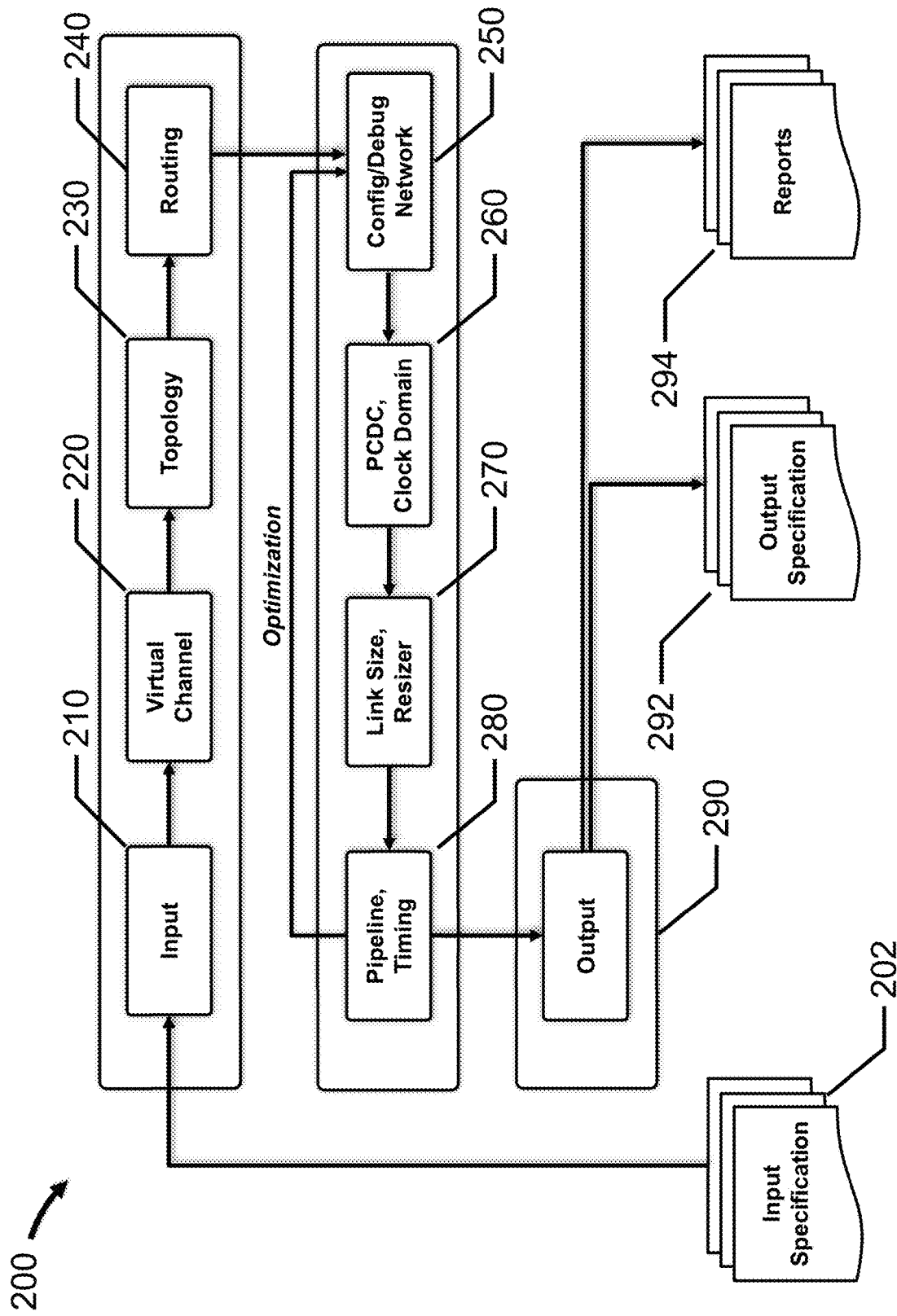
FIG. 2 depicts a NoC synthesis flow diagram, in accordance with an embodiment of the present disclosure.

FIG. 2 depicts NoC synthesis flow diagram 200, in accordance with an embodiment of the present disclosure.

As discussed above, the software modules include NoC synthesis module 134 that provides functionality for synthesizing the NoC architecture. In certain embodiments, NoC synthesis module 134 includes a plurality of modules, each module providing specific individual functionality for synthesizing the NoC architecture, such as, for example, an input module, a VC module, a topology module, a routing module, a network generation module, a PCDC module, a link size and resizer module, a pipeline and timing component module, an output module, etc.

At 210, NoC input specification 202 is retrieved from memory 130 and design information for the NoC is determined. For example, NoC input specification 202 may be received over network 20 and then stored as data 138 in memory 130. In another example, NoC input specification 202 may be created by a NoC designer using one or more software modules 136, and then stored as data 138 in memory 130.

Design information for the NoC includes, for example, physical data, device data, bridge data, traffic data, etc. Additional design information may include voltage domain data, power domain data, clock domain data, address region data, synthesis constraints, etc.

Physical data include the dimensions for the NoC and a list of unrouteable areas. NoC components, such as bridges, routers, pipelines, resizers, connections, etc., are not typically located within unrouteable areas. In one example, the NoC is modeled as an array of cells arranged in rows and columns. The number of rows is defined by a height (in cells), and the number of columns is defined by a width (in cells). A cell width, in millimeters, micrometers, inches, etc., may also be provided. The cells are numbered sequentially, starting in the upper left corner of the array. Data for each unrouteable area include a location (cell number) and dimensions, such as a width (in cells) and a height (in cells). In another example, the NoC is modeled as a grid defined by cartesian coordinates (X, Y), with the origin located in the lower left corner of the grid. The height and the width are provided in normalized units, and a normalization factor may also be provided. Data for each unrouteable area include a location (X,Y) and dimensions, such as a width (X) and a height (Y).

Device data include a list of devices, such as IP cores, IC modules, etc., located within the NoC. Each device includes one or more bridge ports (i.e., signal interfaces). Data for each device may include a name, a location (cell number, X-Y coordinates, etc.), dimensions including a width (in cells, X dimension, etc.) and a height (in cells, Y dimension, etc.), a power domain, etc.

Bridge data include a list of bridge ports for the devices. Data for each bridge port may include a name, an associated device name, a location (cell number, X-Y coordinates, etc.), a data width (in bits), a low/high wire indicator, etc.

In many embodiments, the NoC is a packet-switched network that divides data packets into a sequence of message flow control units or flits. Each flit has the same size (in bits), and is divided into a sequence of data transfers across a physical connection or link. A physical unit, or phit, is the number of bits that can be transferred in parallel in a single data transfer cycle across the physical connection, i.e., the bitwidth of the link. In one example, the flit size for the NoC is 128 bits. A bridge port having a data width (phit size) of 32 bits needs 4 data transfer cycles to transfer each flit. In the context of the present disclosure, the link size for this bridge port is 4 (each unit of link size is 32 bits). Similarly, a bridge port having a data width of 16 bits needs 8 data transfer cycles to transfer each flit and has a link size of 8 (each unit of link size is 16 bits), while a bridge port having a data width of 64 bits needs 2 data transfer cycles to transfer each flit and has a link size of 2 (each unit of link size is 64 bits). Other flit sizes, such as, for example, 32 bits, 64 bits, 256 bits, 512 bits, etc. may also be used. Different flow control techniques may be used in alternative embodiments.

Traffic data include a list of traffic flows for the NoC. Data for each traffic flow include a source bridge port, a destination bridge port, a peak traffic rate, an average traffic rate, and a traffic class. The source bridge port and the destination bridge port are included within the list of bridge ports. The peak traffic rate and the average traffic rate are provided in bits or bytes per second, such as, for example, b/s, kb/s, Mb/s, Gb/s, Tb/s, etc., B/s, KB/s, MB/s, GB/s, TB/s, etc. Generally, the traffic class provides one or more metrics that differentiate the level of NoC performance that may be provided for each traffic flow. In many embodiments, the traffic class includes a quality of service (QoS) metric and a latency sensitivity (LS) metric. The QoS metric provides a mechanism to prioritize traffic within the NoC, while the LS metric indicates the sensitivity of the traffic to network delays. For example, for an integer QOS metric with four possible values (e.g., 0 to 3) and a Boolean LS metric with two possible values (e.g., true or false), 8 different traffic classes are provided. In this example, a QoS value of 0 and an LS value of true provides the best potential NoC performance. Other metrics are also contemplated. Additionally, a message type may also be provided, such as, for example, a read request, a write request, a read/write request, etc.

Figure 4:
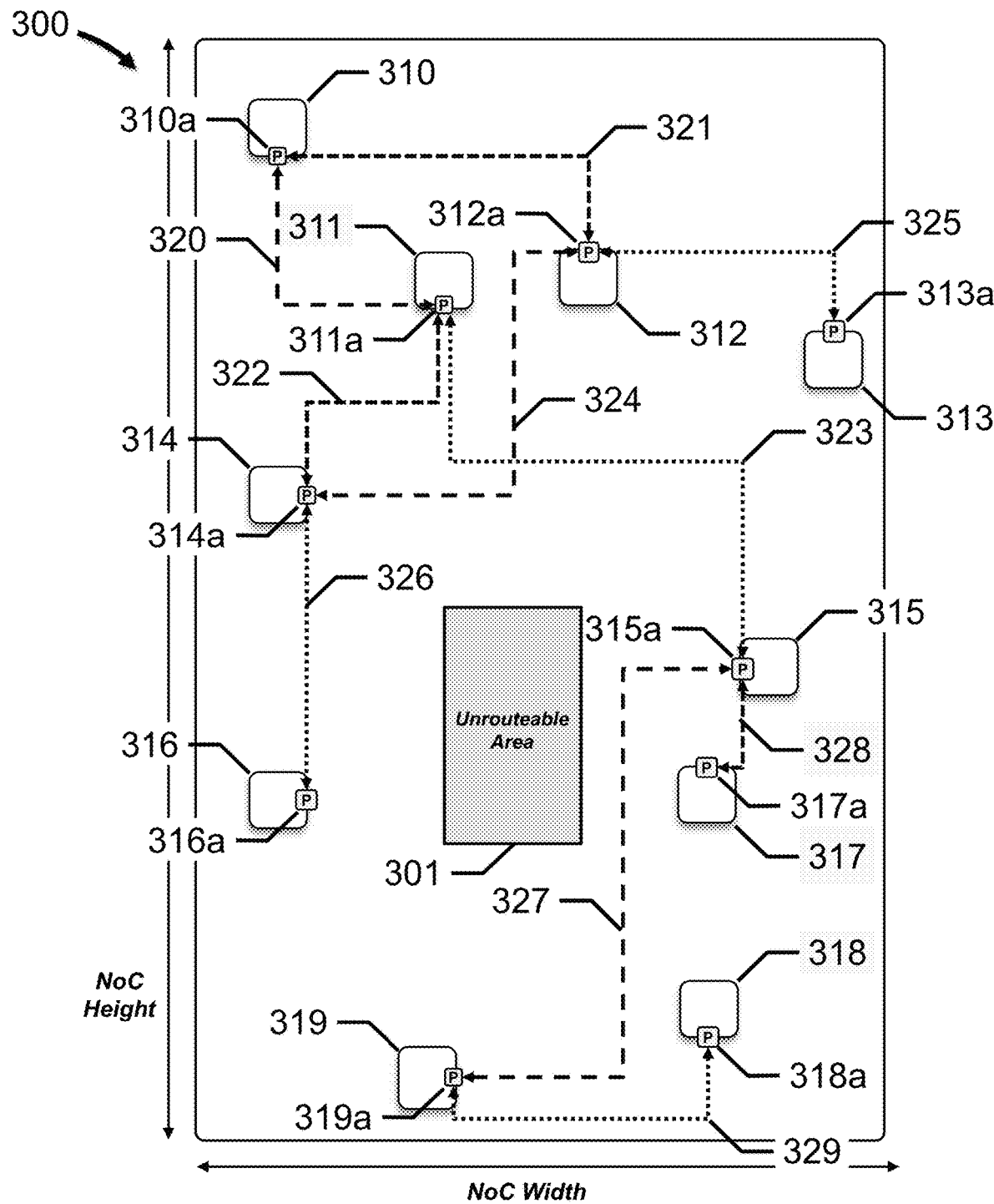
FIG. 4 depicts a graphical representation of an input specification for a NoC, in accordance with an embodiment of the present disclosure.

FIG. 4 depicts a graphical representation of NoC input specification 202, in accordance with an embodiment of the present disclosure. A user may view NoC 300 on display 152.

NoC 300 has a NoC height and a NoC width and includes unrouteable area 301 located within a central portion of NoC 300. Ten devices are dispersed throughout NoC 300, none of which are located within unrouteable area 301. Each device includes at least one bridge port ("P"). For ease of illustration, each device has a single bridge port. Device 310 includes bridge port 310a, device 311 includes bridge port 311a, device 312 includes bridge port 312a, device 313 includes bridge port 313a, device 314 includes bridge port 314a, device 315 includes bridge port 315a, device 316 includes bridge port 316a, device 317 includes bridge port 317a, device 318 includes bridge port 318a, and device 319 includes bridge port 319a. Generally, the location of each bridge port is limited by the location of the associated device and the footprint of the device within the NoC, i.e., the device width and height. For example, for an 8 cell×8 cell NoC, a device located at cell number 9 having a width of 1 cell and a height of 3 cells supports one or more bridge ports located at cell numbers 9, 17 and/or 25.

Twelve sets of traffic flows between the devices are depicted; each traffic flow set includes at least one traffic flow. For example, a traffic flow set may include a traffic flow that defines a read request and a traffic flow that defines a write request. Traffic flow set 320 flows between bridge port 310a and bridge port 311a. Traffic flow set 321 flows between bridge port 310a and bridge port 312a. Traffic flow set 322 flows between bridge port 311a and bridge port 314a. Traffic flow set 323 flows between bridge port 311a and bridge port 315a. Traffic flow set 324 flows between bridge port 312a and bridge port 314a. Traffic flow set 325 flows between bridge port 312a and bridge port 313a. Traffic flow set 326 flows between bridge port 314a and bridge port 316a. Traffic flow set 327 flows between bridge port 315a and bridge port 319a. Traffic flow set 328 flows between bridge port 315a and bridge port 317a. Traffic flow set 329 flows between bridge port 318a and bridge port 319a.

Referring back to FIG. 2, at 220, a VC is assigned to each traffic flow. Generally, VCs are assigned to reduce conflicts and simplify the subsequent topology generation. In one embodiment, the VCs are assigned using an iterative estimation process that performs a specify-evaluate-refine loop until no significant improvement in the estimations are generated. Other assignment methodologies are also contemplated.

At 230, a topology for the NoC is determined.

Figure 3:
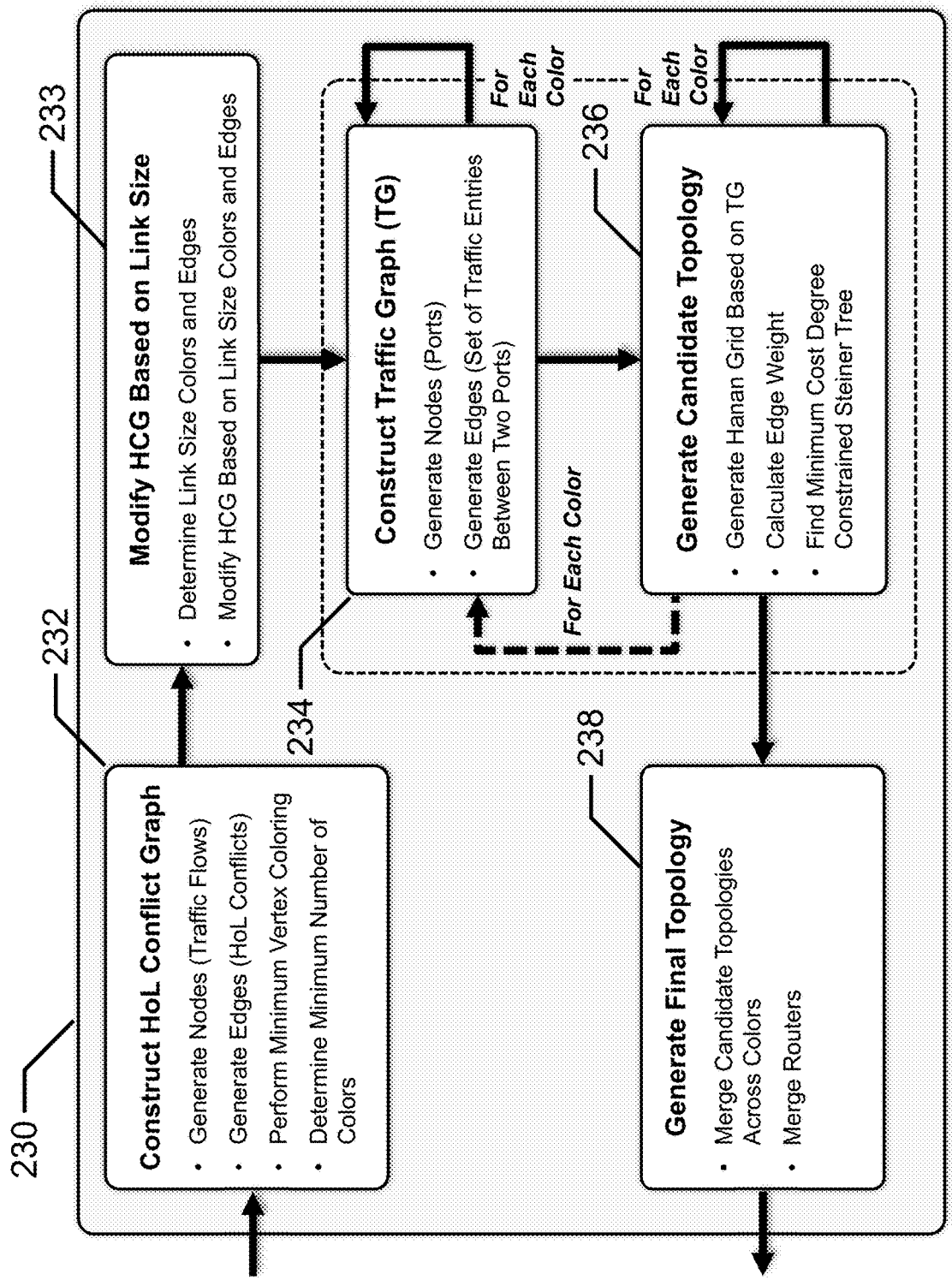
FIG. 3 depicts functionality associated with determining the topology for the NoC, in accordance with an embodiment of the present disclosure.

FIG. 3 depicts functionality associated with determining the topology for the NoC, in accordance with an embodiment of the present disclosure.

At 232, an HCG is constructed based on the traffic data and the VC assignments.

Figure 5:
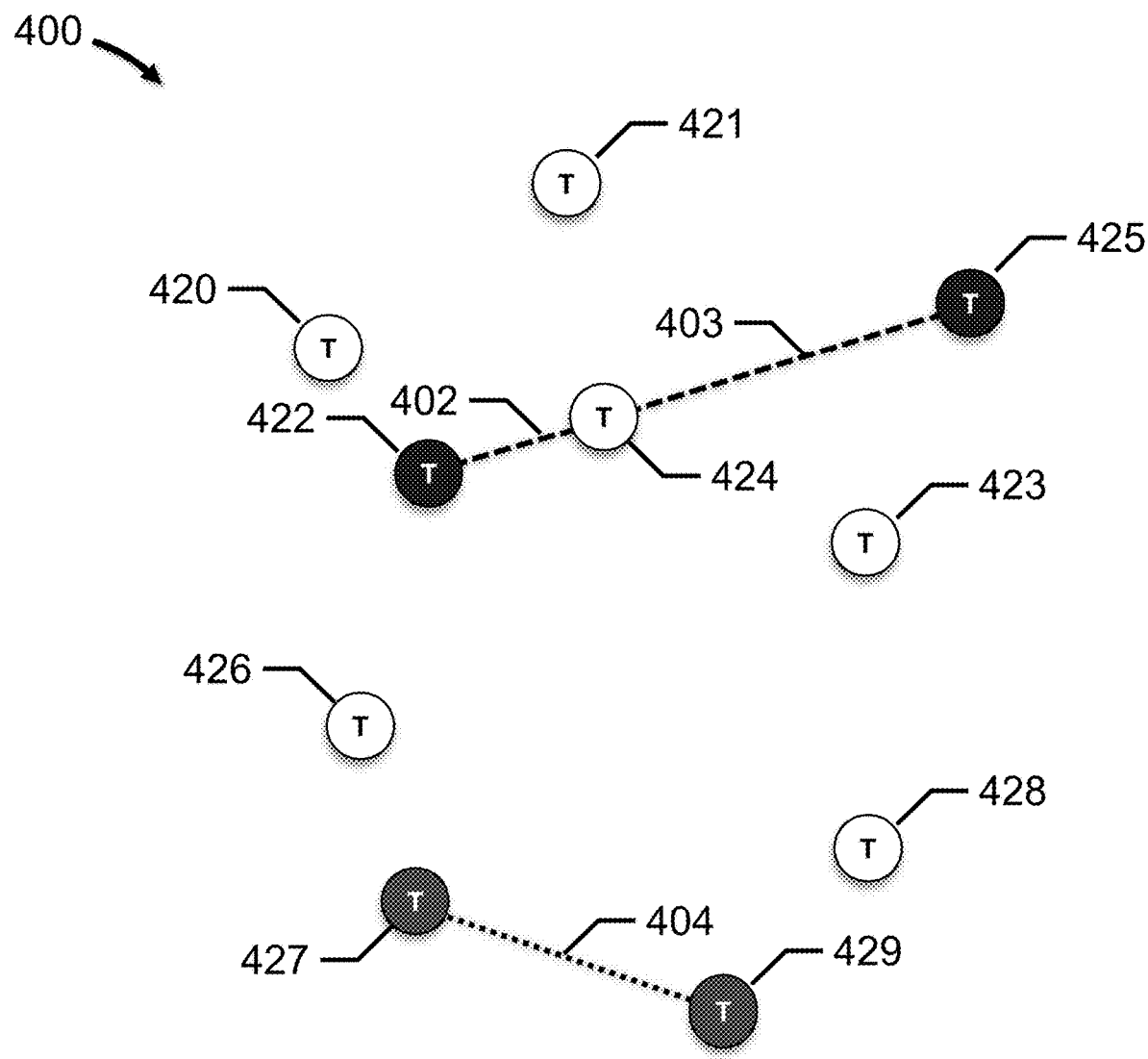
FIG. 5 depicts an HoL conflict graph (HCG) for a NoC, in accordance with an embodiment of the present disclosure.

FIG. 5 depicts HCG 400 for NoC 300, in accordance with an embodiment of the present disclosure. A user may view HCG 400 on display 152.

HCG 400 includes traffic nodes 420 to 429 and HoL edges 402, 403. Each traffic node represents a traffic flow and each HoL edge represents an HoL conflict. An HoL conflict is defined as two traffic flows that are assigned to the same VC but have different traffic classes, such as, for example, different QoS values and/or different LS values. For the purpose of illustration only, each traffic flow set 320 to 331 has a single traffic flow, which results in ten traffic nodes 420 to 429. A color is then assigned to each traffic node 420 to 429 to minimize HoL conflicts, with adjacent traffic nodes receiving different colors. In certain embodiments, minimum vertex coloring is used to find the minimum number of colors to assign to traffic nodes 420 to 429. HCG 400 includes eight traffic nodes 420, 421, 423, 424, 426 and 428 in a first color (white), and two traffic nodes 422 and 425 in a second color (blue). Initially, traffic nodes 427 and 429 are colored the first color (white) based on the HoL analysis.

Referring back to FIG. 3, at 233, generally, HCG 400 is modified based on the bridge data and the traffic data to generate a modified HCG. More particularly, HCG 400 is modified based on link size.

Referring back to FIG. 5, in one embodiment, the modifications to HCG 400 may be determined based on a bin packing routine that creates a number of bins in which to pack the bridges while satisfying a maximum link size constraint. Each bin represents a different link size color, and each bin has a size that is the maximum link size.

For each bridge, a link size for each channel (e.g., port) of each bridge is calculated based on the bridge data and traffic data, and the link size for the bridge is determined to be the maximum of channel (e.g., port) link size of the bridge. The bridges are then packed into the bins based on the bridge's link size. Accordingly, the bridges are packed into bins while satisfying the maximum link size constraint.

In one embodiment of NoC input specification 202 depicted in FIG. 4, each traffic flow set originates at a source bridge port and terminates at a destination bridge port. Traffic flow set 320 flows from bridge port 310a to bridge port 311a, traffic flow set 321 flows from bridge port 310a to bridge port 312a, traffic flow set 322 flows from bridge port 311a to bridge port 314a, traffic flow set 323 flows from bridge port 311a to bridge port 315a, traffic flow set 324 flows from bridge port 314a to bridge port 312a, traffic flow set 325 flows from bridge port 313a to bridge port 312a, traffic flow set 326 flows from bridge port 316a to bridge port 314a, traffic flow set 327 flows from bridge port 319a to bridge port 315a, traffic flow set 328 flows from bridge port 317a to bridge port 315a, and traffic flow set 329 flows from bridge port 318a to bridge port 319a.

The link sizes are then determined for each source bridge port. In this embodiment, bridge port 310a has a link size of 4, bridge port 311a has a link size of 4, bridge port 313a has a link size of 2, bridge port 314a has a link size of 2, bridge port 316a has a link size of 2, bridge port 317a has a link size of 2, bridge port 318a has a link size of 8, bridge port 319a has a link size of 12, the maximum link size is 22, and each unit of link size is 45 bits.

Bin 1 is initially created with a size of 22, and the bridge ports are then successively packed into bin 1 until adding a particular bridge port to bin 1 would exceed the size for bin 1, i.e., 22. That bridge port would then be packed into the next bin with available capacity. Bridge port 310a (link size of 4) is first successfully packed into bin 1, and the accumulated link size for bin 1 is 4. Bridge port 311a (link size of 4) is then successfully packed into bin 1, and the accumulated link size for bin 1 is 8. Bridge port 313a (link size of 2) is then successfully packed into bin 1, and the accumulated link size for bin 1 is 10. Bridge port 314a (link size of 2) is then successfully packed into bin 1, and the accumulated link size for bin 1 is 12. Bridge port 316a (link size of 2) is then successfully packed into bin 1, and the accumulated link size for bin 1 is 14. Bridge port 317a (link size of 2) is then successfully packed into bin 1, and the accumulated link size for bin 1 is 16.

Bridge port 318a (link size of 8) is then attempted to be packed into bin 1, but the accumulated link size for bin 1 would be 24, which exceeds the size of bin 1, i.e., 22. So, bin 2 is created with a size of 22, bridge port 314a is then successfully packed into bin 2, and the accumulated link size for bin 2 is 12. Bridge port 319a (link size of 12) is then attempted to be packed into bin 1, but the accumulated link size for bin 1 would be 28, which exceeds the size of bin 1, i.e., 22. So, bridge port 319a is then successfully packed into bin 2, and the accumulated link size for bin 2 is 20. After packing, bin 1 has an accumulated link size and 16 and bin 2 has an accumulated link size of 20, each satisfying the maximum link size constraint of 22.

Bridge ports 310a, 311a, 313a, 314a, 316a, and 317a have been packed into bin 1, traffic nodes 420, 421, 422, 423, 424, 425, 426 and 428 are assigned the first color (i.e., white), and no edges are needed to be established in HCG 400. Bridge ports 318a and 319a have been packed into bin 2, traffic nodes 427 and 429 are re-assigned a third color (i.e., red), and edge 404 has been added. Traffic nodes 420 to 429 satisfy the maximum link size constraint.

In other embodiments, the functionality provided at 233 may be performed in parallel with the functionality provided at 232, i.e., the HCG nodes may be colored in parallel based on HoL conflict minimization and link size constraints.

Referring back to FIG. 3, at 234, a TG for each color is constructed based on the physical data, the bridge data, the traffic data, and the modified HCG. In other words, a plurality of traffic graphs are constructed based on the physical data, the bridge data, the traffic data and the modified HCG.

Figure 6:
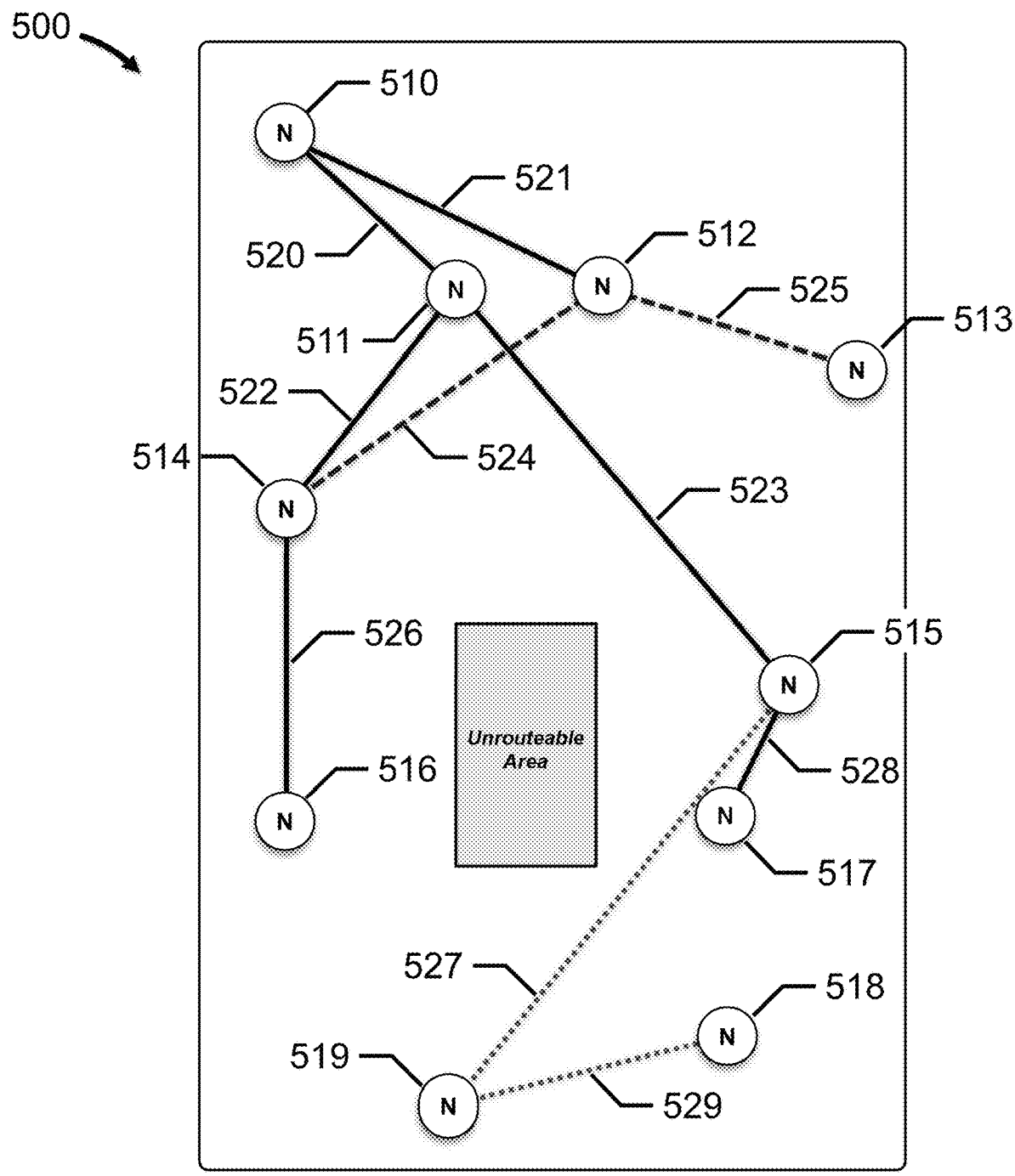
FIG. 6 depicts a traffic graph (TG) for a NoC, in accordance with an embodiment of the present disclosure.
Figure 7A:
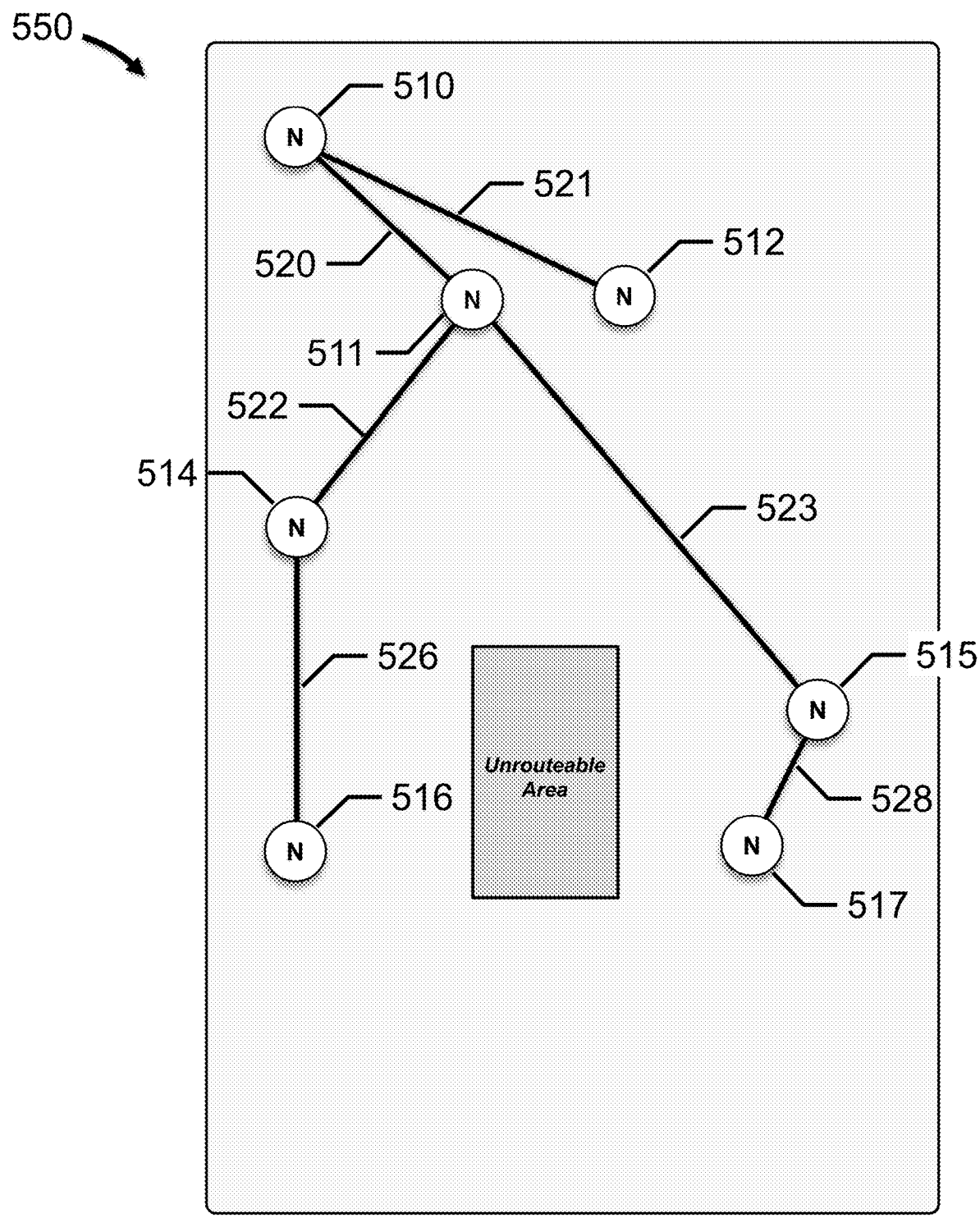
FIGS. 7A to 7F depict a series of graphs, grids and topologies for a first color of the TG depicted in FIG. 6, in accordance with an embodiment of the present disclosure.
Figure 8A:
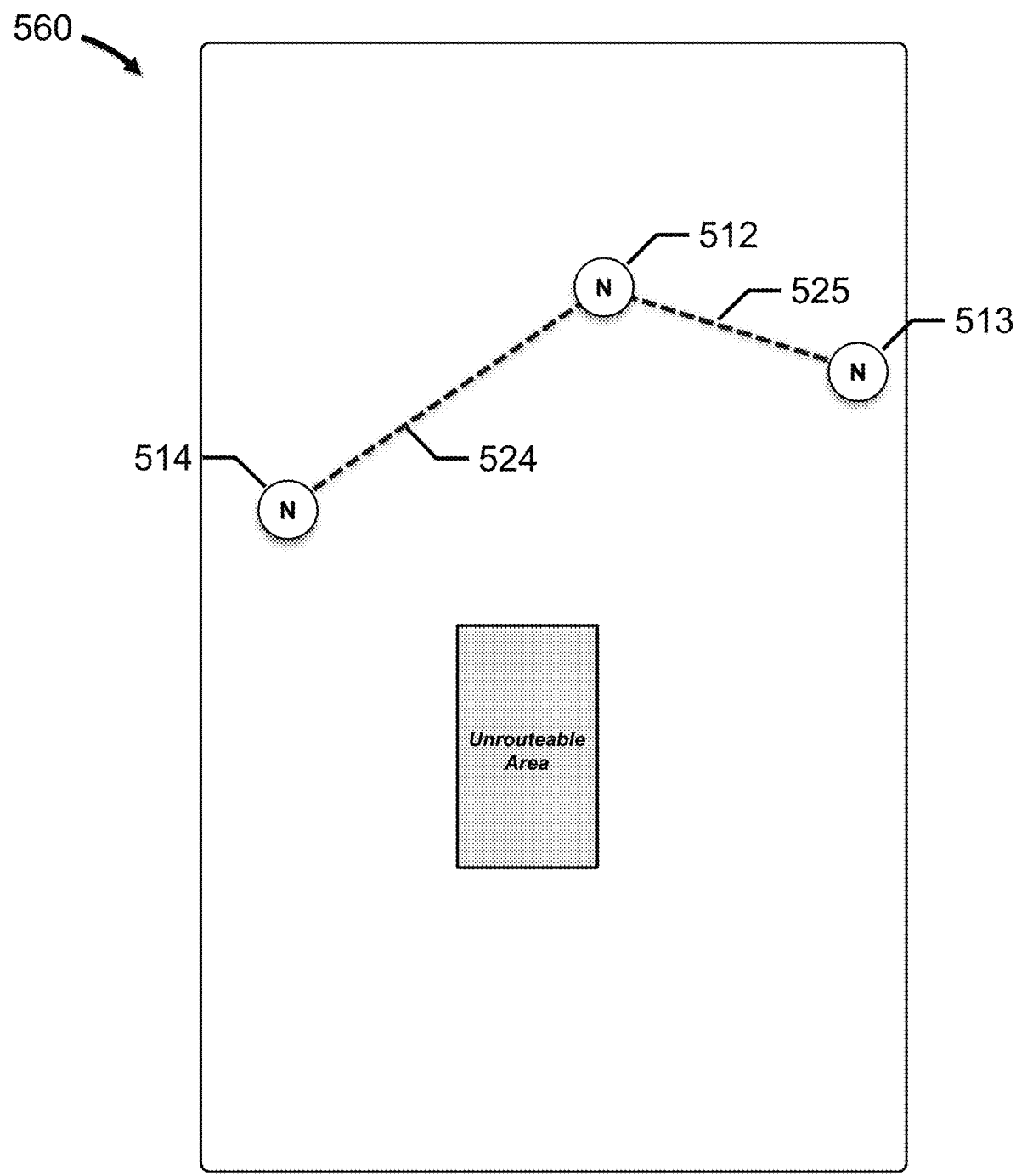
FIGS. 8A to 8F depict a series of graphs, grids and topologies for a second color of the TG depicted in FIG. 6, in accordance with an embodiment of the present disclosure.
Figure 9A:
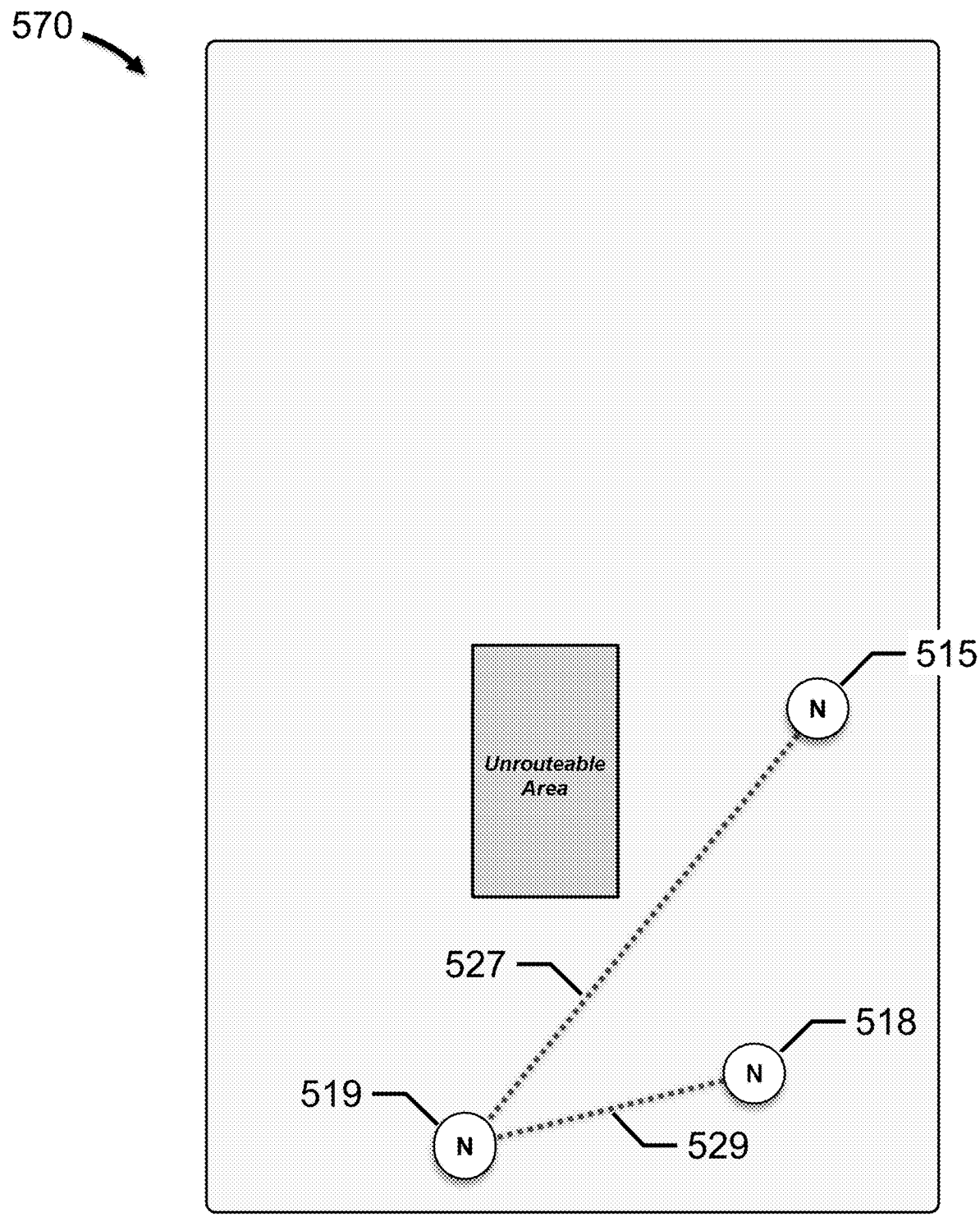
FIGS. 9A to 9F depict a series of graphs, grids and topologies for a third color of the TG depicted in FIG. 6, in accordance with an embodiment of the present disclosure.

FIG. 6 depicts TG 500 for NoC 300, in accordance with an embodiment of the present disclosure. TG 500 includes all of the colors from HCG 400. FIG. 7A depicts TG 550 that includes the first color (white) from TG 500, FIG. 8A depicts TG 560 that includes the second color (blue) from TG 500, and FIG. 9A depicts TG 570 that includes the third color (red) from TG 500. A user may view TGs 500, 550, 560 and TG 570 on display 152.

TG 500 includes nodes 510 to 519 and edges 520 to 529. Each node 510 to 519 is associated with a different bridge port, and each edge 520 to 529 connects pairs of nodes and is associated with a set of traffic flows between two bridge ports. As discussed above, each set of traffic flows includes at least one traffic flow.

More particularly, node 510 is associated with bridge port 310a, node 511 is associated with bridge port 311a, node 512 is associated with bridge port 312a, node 513 is associated with bridge port 313a, node 514 is associated with bridge port 314a, node 515 is associated with bridge port 315a, node 516 is associated with bridge port 316a, node 517 is associated with bridge port 317a, node 518 is associated with bridge port 318a, and node 519 is associated with bridge port 319a. Similarly, edge 520 is associated with traffic flow set 320, edge 521 is associated with traffic flow set 321, edge 522 is associated with traffic flow set 322, edge 523 is associated with traffic flow set 323, edge 524 is associated with traffic flow set 324, edge 525 is associated with traffic flow set 325, edge 526 is associated with traffic flow set 326, edge 527 is associated with traffic flow set 327, edge 528 is associated with traffic flow set 328, and edge 529 is associated with traffic flow set 329.

At 236, the candidate topology for each color is generated based on the respective TG. In other words, a candidate topology is generated for each TG. The candidate topology includes bridge ports, routers and connections.

FIGS. 7B to 7F depict a series of grids and topologies for TG 550, FIGS. 8B to 8F depict a series of grids and topologies for TG 560, and FIGS. 9B to 9F depict a series of grids and topologies for TG 570, in accordance with an embodiment of the present disclosure. A user may view these grids and topologies on display 152.

First, a grid is generated based on the TG. The grid includes nodes and intersections that are formed by grid lines passing through each node. Each node is associated with a different bridge port and is located at a different intersection. In one embodiment, the grid is a Hanan grid formed by orthogonal vertical and horizontal grid lines. Other types of grids may also be generated, such as, for example, a lattice, a square or unit distance grid, etc.

Generally, the functionality at 234 and 236 is performed for each color. In one embodiment, the functionality at 234 is performed for all of the colors, and then the functionality at 236 is performed for all of the colors. In another embodiment, the functionality at 234 is performed for the first color, and then the functionality at 236 is performed for the first color. Next, the functionality at 234 is performed for the second color, and then the functionality at 236 is performed for the second color, and so on.

Figure 7B:
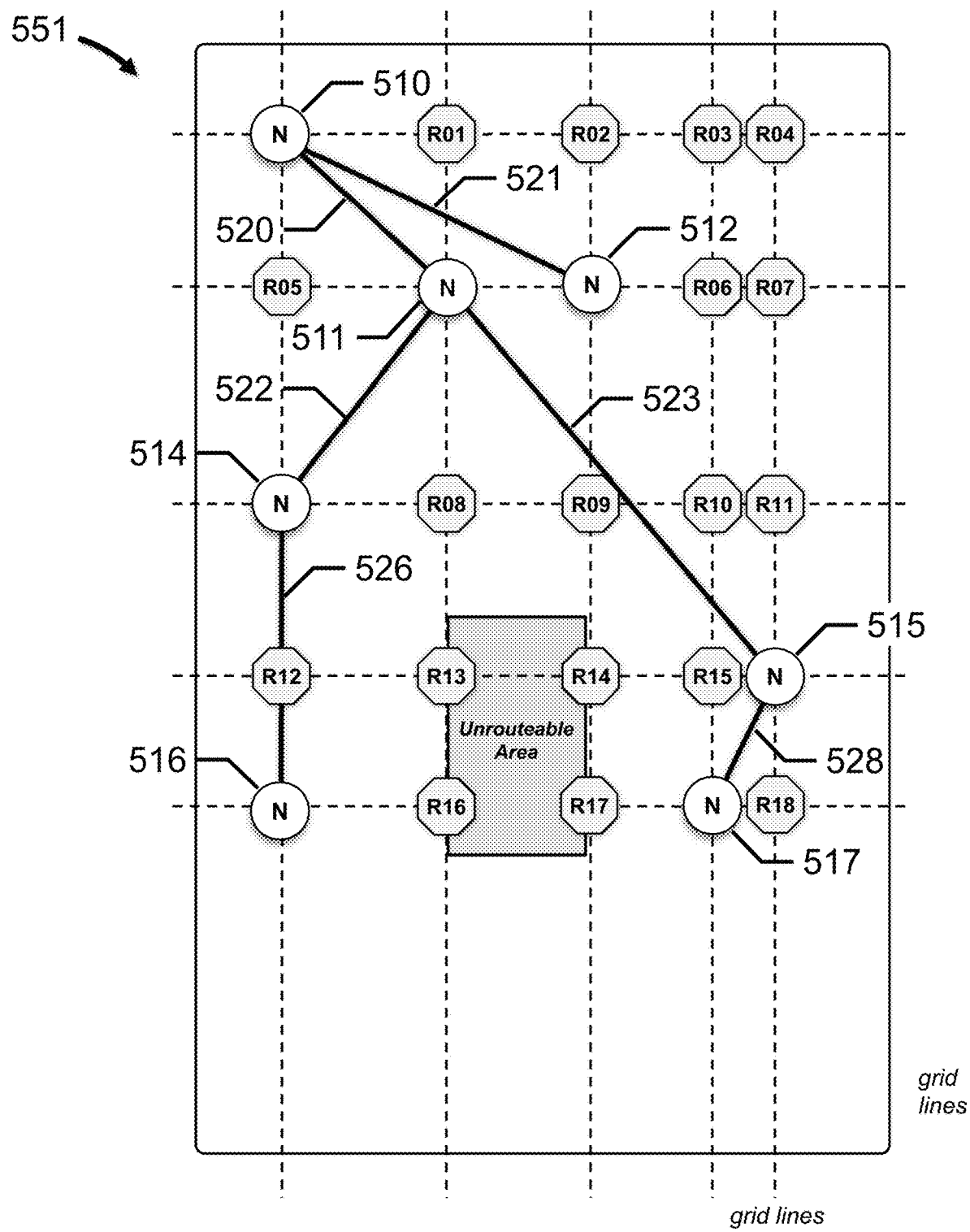
Figure 8B:
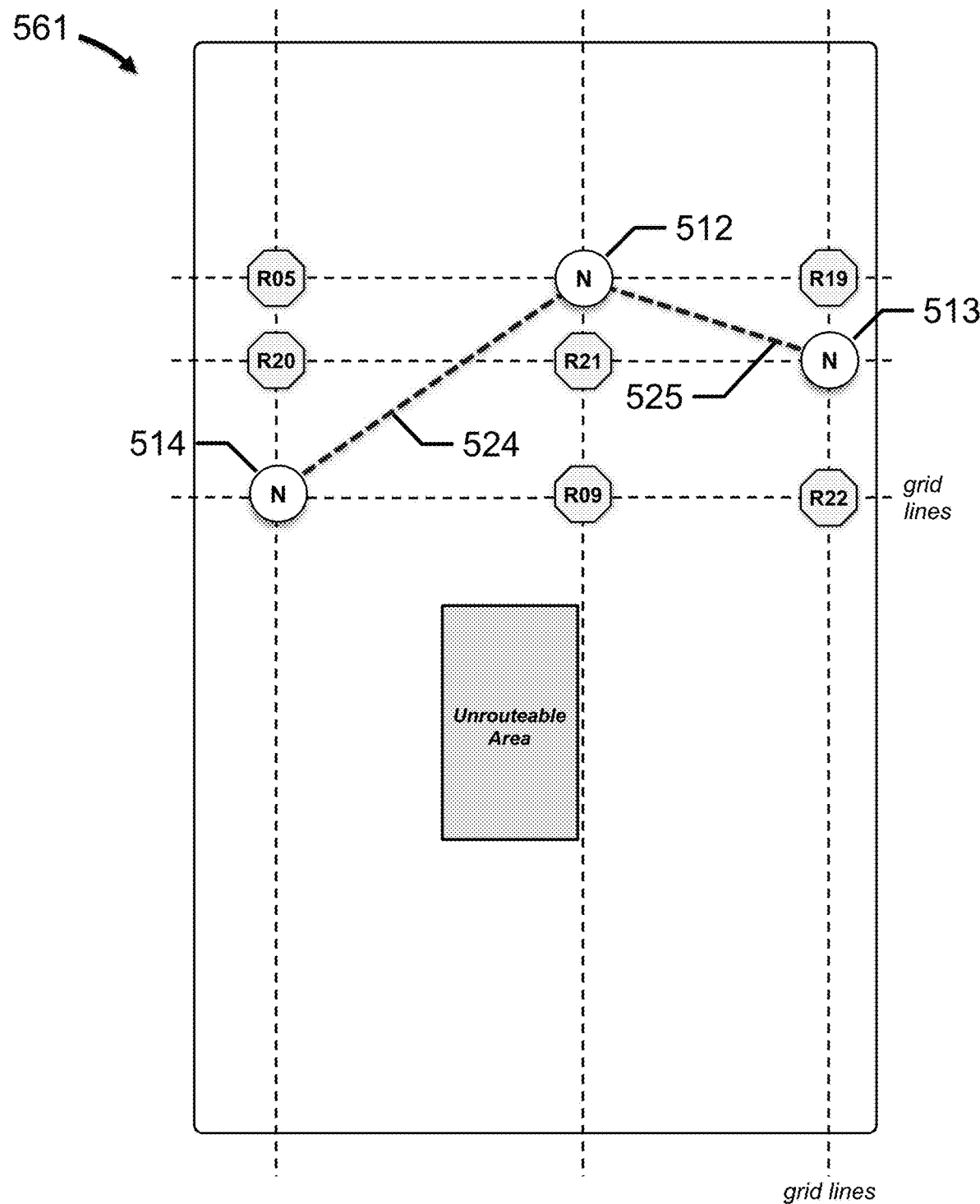
Figure 9B:
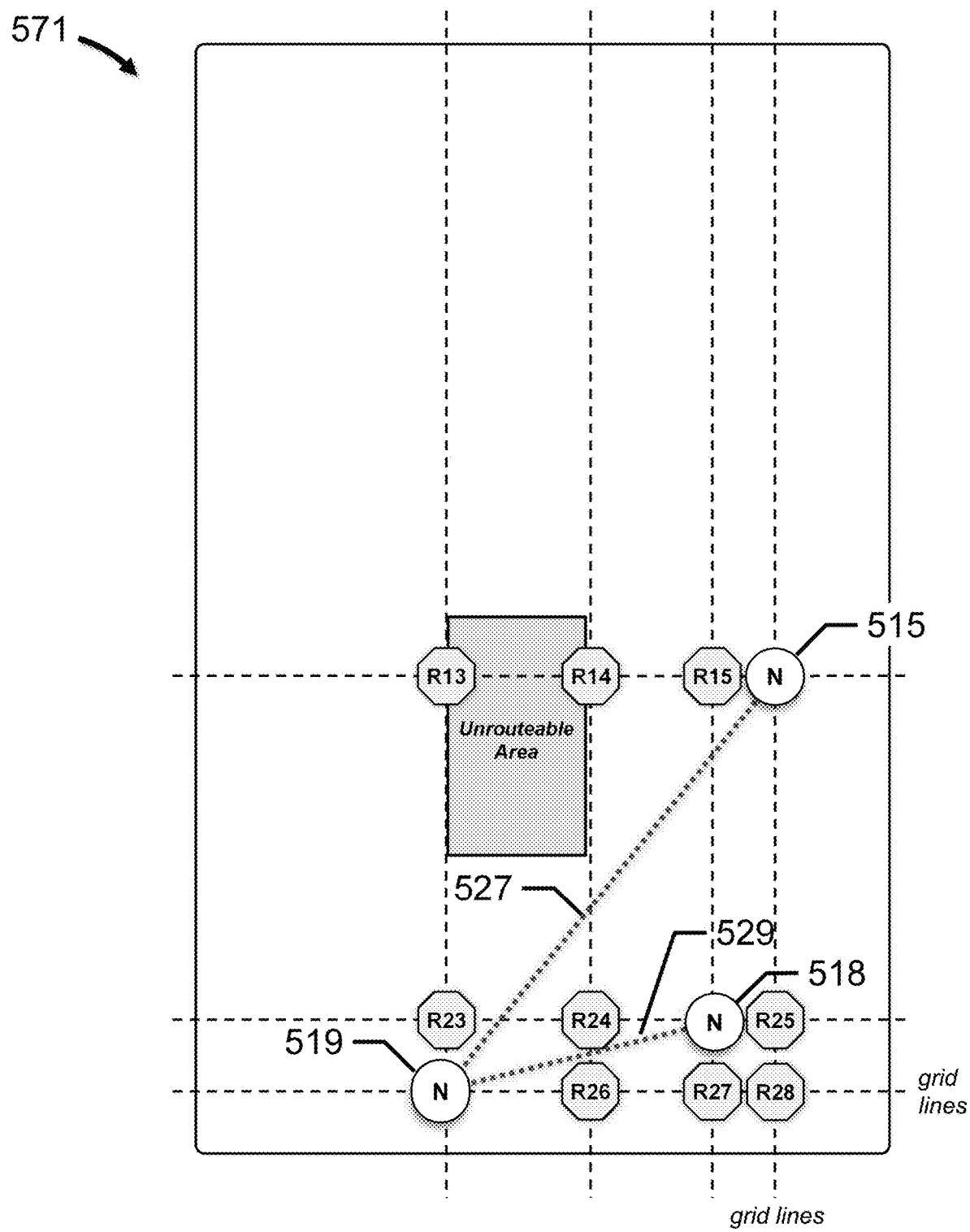

FIG. 7B depicts Hanan grid 551 for TG 550; nodes 510 to 512 and 514 to 517 are located at respective intersections. FIG. 8B depicts Hanan grid 561 for TG 560; nodes 512, 513 and 514 are located at respective intersections. FIG. 9B depicts Hanan grid 571 for TG 570; nodes 518 and 519 are located at respective intersections.

Routers are then added to the grid. Each router is located at an intersection not occupied by a node.

FIG. 7B also depicts routers R01 to R18 located at each intersection of Hanan grid 551 not occupied by one of nodes 510 to 512 and 514 to 517. Similarly, FIG. 8B also depicts routers R05, R09 and R19 to R22 located at each intersection of Hanan grid 561 not occupied by one of nodes 512, 513 and 514. And, FIG. 9B also depicts routers R13 to R15 and R23 to R28 located at each intersection of Hanan grid 561 not occupied by one of nodes 515, 518 and 519. Because Hanan grid 551 and Hanan grid 561 include nodes 512 and 514, several grid lines overlap, and routers R05 and R09 are located at the same intersection in both grids. Similarly, because Hanan grid 551 and Hanan grid 571 include node 515, one grid line overlaps, and routers R13 to R15 are located at the same intersection in both grids.

Adjacent nodes and routers are then connected to create an initial mesh or topology.

Figure 7C:
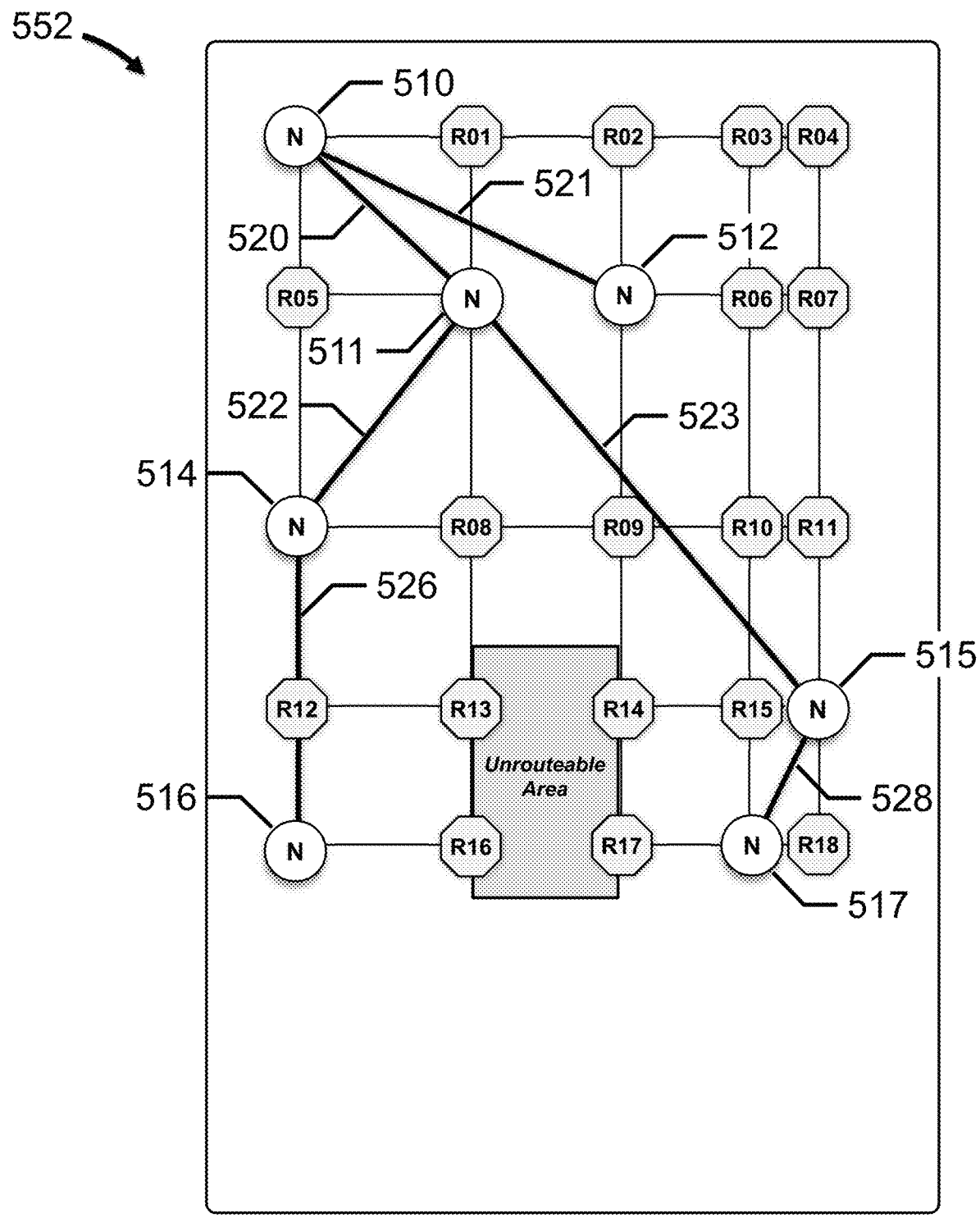

FIG. 7C depicts an initial mesh or topology 552 for TG 550. Node 510 is connected to routers R01 and R05, node 511 is connected to routers R01, R05 and R08, node 512 is connected to routers R02, R06 and R09, node 514 is connected to routers R05, R08 and R12, node 515 is connected to routers R11, R15 and R18, node 516 is connected to routers R12 and R16, node 517 is connected to routers R15, R17 and R18.

Router R01 is connected to nodes 510, 511 and router R02, router R02 is connected to node 512 and routers R01 and R03, router R03 is connected to routers R02, R04 and R06, router R04 is connected to routers R03 and R07, router R05 is connected to nodes 510, 511 and 514, router R06 is connected to node 512 and routers R03, R07 and R10, router R07 is connected to routers R04, R06 and R11, router R08 is connected to nodes 511, 514 and routers R09 and R13, router R09 is connected to node 512 and routers R08, R10 and R14, router R10 is connected to routers R06, R09, R11 and R15, router R11 is connected to node 515 and routers R07 and R10, router R12 is connected to nodes 514, 516 and router R13, router R13 is connected to routers R08, R12 and R16, router R14 is connected to routers R09, R15 and R17, router R15 is connected to nodes 515, 517 and routers R10 and R14, router R16 is connected to node 516 and router R13, router R17 is connected to node 517 and router R14, and router R18 is connected to nodes 515, 517.

Figure 8C:
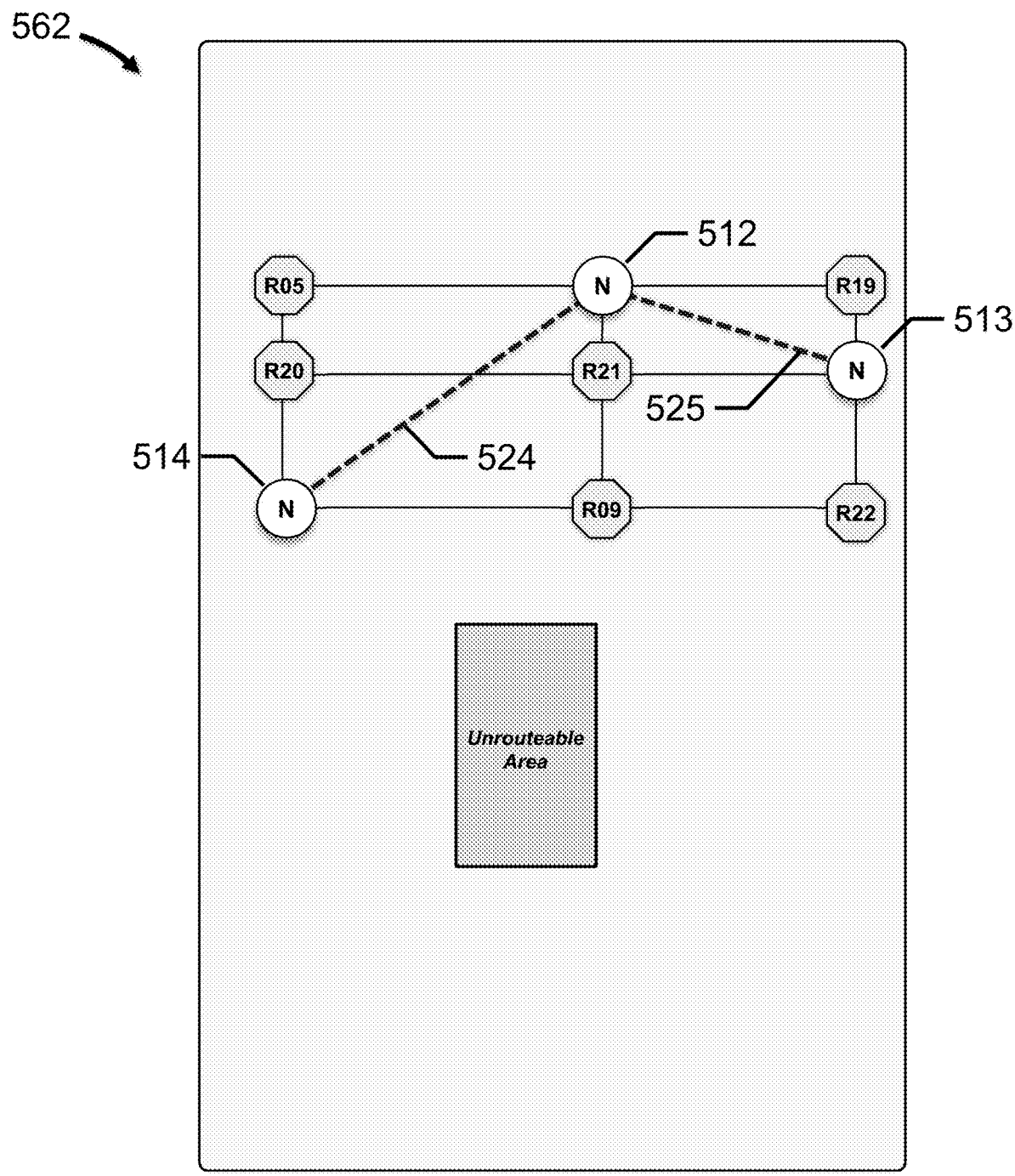

FIG. 8C depicts an initial mesh or topology 562 for TG 560. Node 512 is connected to routers R05, R19 and R21, node 513 is connected to routers R19, R21 and R22, and node 514 is connected to routers R09 and R20. Router R05 is connected to node 512 and router R20, router R19 is connected to nodes 512 and 513, router R20 is connected to node 514 and routers R05 and R21, router R21 is connected to nodes 512 and 513 and routers R20 and R09, router R09 is connected to node 514 and routers R21 and R22, and router R22 is connected to node 513 and router R09.

Figure 9C:
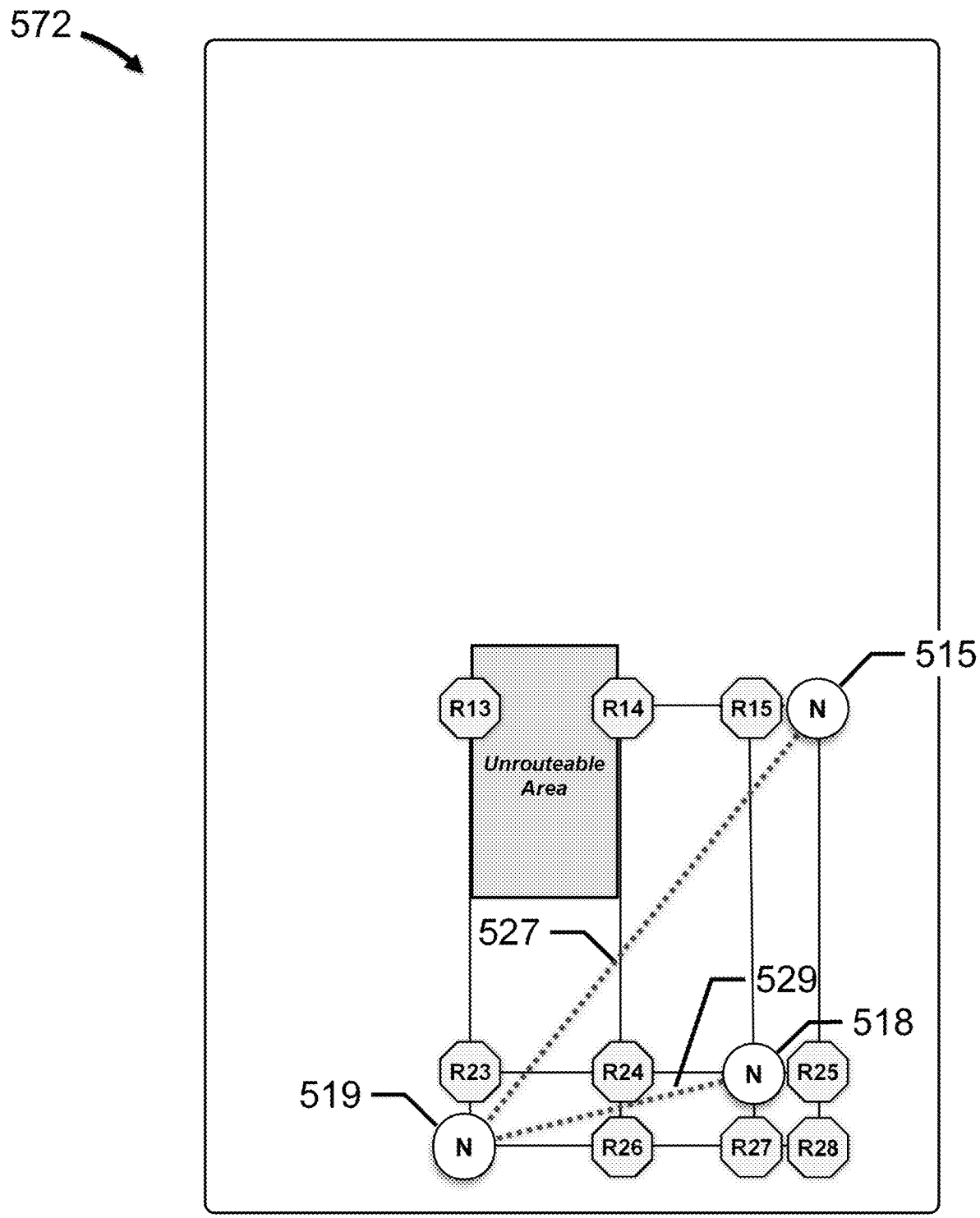

FIG. 9C depicts an initial mesh or topology 572 for TG 570. Node 515 is connected to routers R15 and R25, node 518 is connected to routers R15, R24, R25 and R27, and node 519 is connected to routers R23 and R26. Router R13 is connected to router R23, router R14 is connected to routers R15 and R24, router R15 is connected to nodes 515 and 518 and router R14, router R23 is connected to node 519 and routers R13 and R24, router R24 is connected to node 518 and routers R14, R23 and R26, router R25 is connected to nodes 515 and 518 and router R28, router R26 is connected to node 519 and routers R24 and R27, router R27 is connected to node 518 and routers R26 and R28, and router R28 is connected to routers R27 and R25.

A weight is then calculated for each connection, based on the traffic data, to create a weighted mesh or topology. In one embodiment, a traffic criticality index (TCI) is calculated for each traffic flow, and the TCI for each traffic flow is then added to a heating index for each connection that falls within a rectilinear bounding box for that traffic flow. The TCI may be based on traffic criticality and rate. The rectilinear bounding box for a particular traffic flow is defined by the source node (source bridge port) and the destination node (destination bridge port) of that traffic flow. In one embodiment, the weight for each connection is inversely proportional to the heating index for that connection, while in another embodiment, the weight is proportional to the heating index. The weights are then applied to the initial mesh or topology to create the weighted mesh or topology.

Figure 7D:
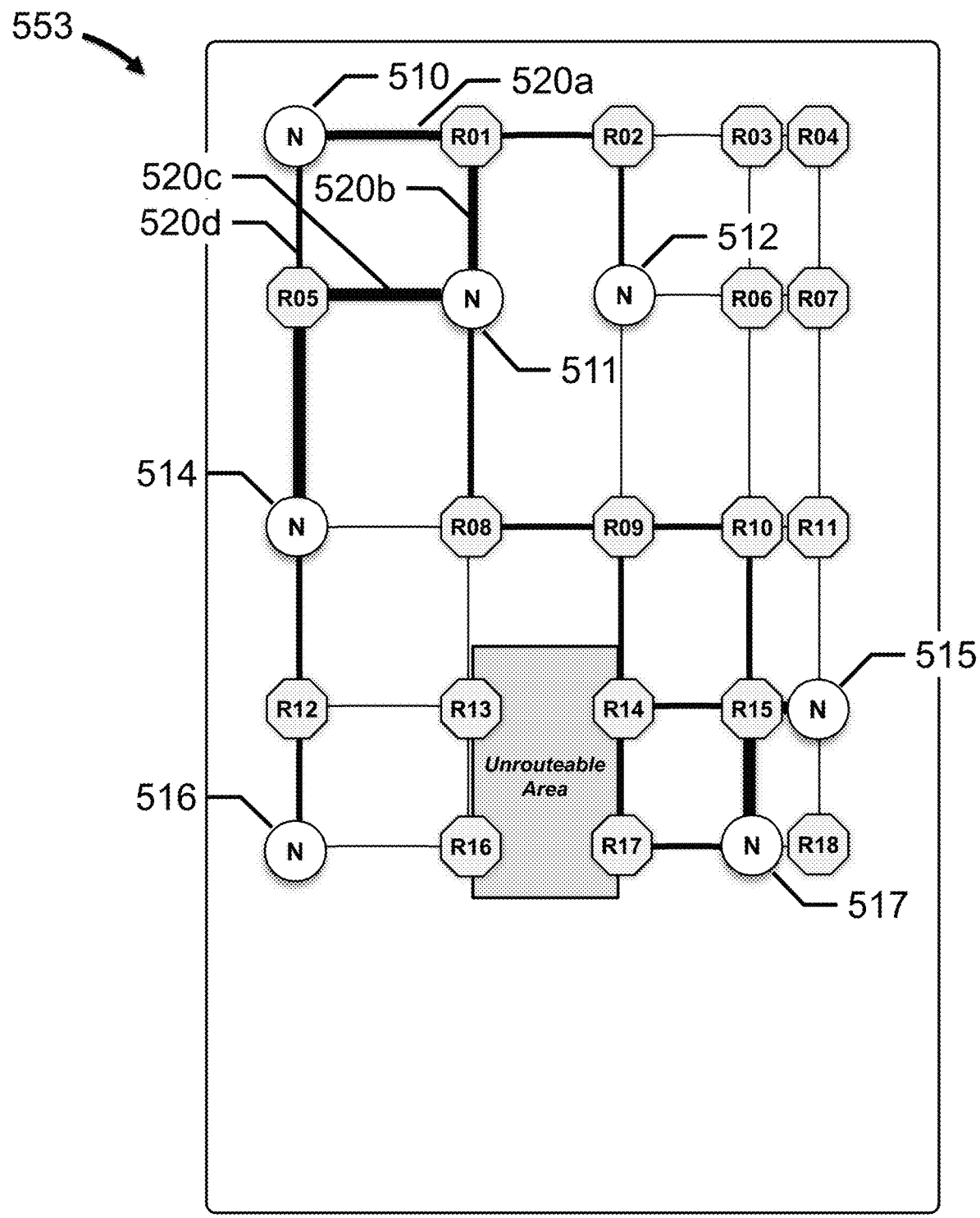

FIG. 7D depicts a weighted mesh or topology 553 for TG 550. The different weights for each connection are represented by different line thicknesses. The thinnest lines represent connections through which traffic does not flow. For example, edge 520 is associated with traffic flow set 320, which includes at least one traffic flow between node 510 (bridge port 310*a*) and node 511 (bridge port 311*a*). The rectilinear bounding box for traffic flow set 320 is defined by node 510 and node 511, represented by connections 520*a*, 520*b*, 520*c* and 520*d*. The weight for connection 520*d* is the lowest, the weight for connection 520*b* is greater than the weight for connection 520*d*, and the weights for connections 520*a* and 520*c* are about the same and greater than the weight for connection 520*b*. Notably, the weight for connection 520*a* includes a contribution from edge 521, and the weight for connection 520*c* includes a contribution from edge 522.

Figure 8D:
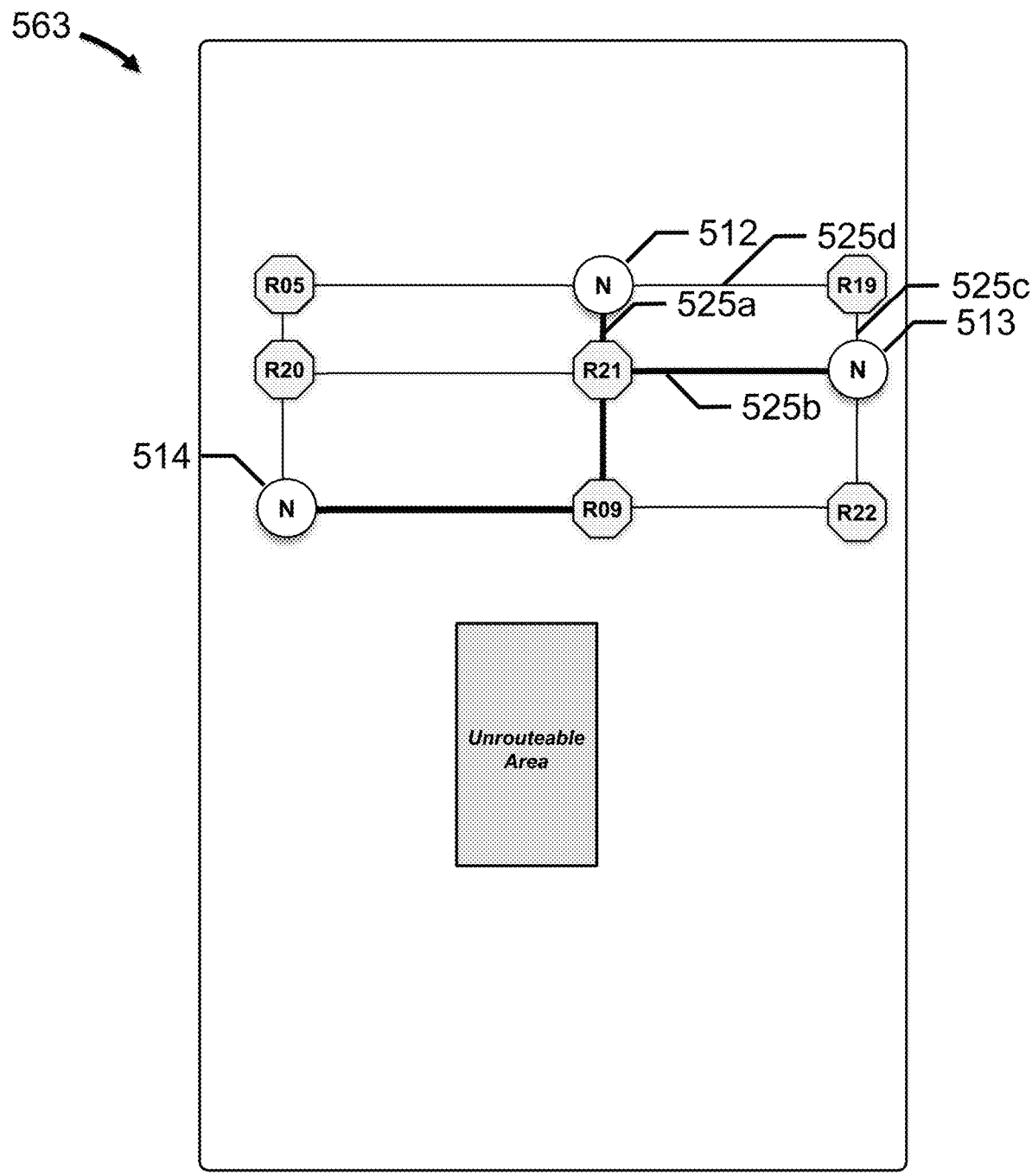

FIG. 8D depicts a weighted mesh or topology 563 for TG 560. The different weights for each connection are represented by different line thicknesses. The thinnest lines represent connections through which traffic does not flow. For example, edge 525 is associated with traffic flow set 325, which includes at least one traffic flow between node 512 (bridge port 312*a*) and node 513 (bridge port 313*a*). The rectilinear bounding box for traffic flow set 325 is defined by node 512 and node 513, represented by connections 525*a*, 525*b*, 525*c* and 525*d*. The weight for connections 520*c* and 520*d* are zero (i.e., no traffic flows), the weight for connection 520*a* is the lowest, and the weight for connection 520*b* is greater than the weight for connection 520*a*.

Figure 9D:
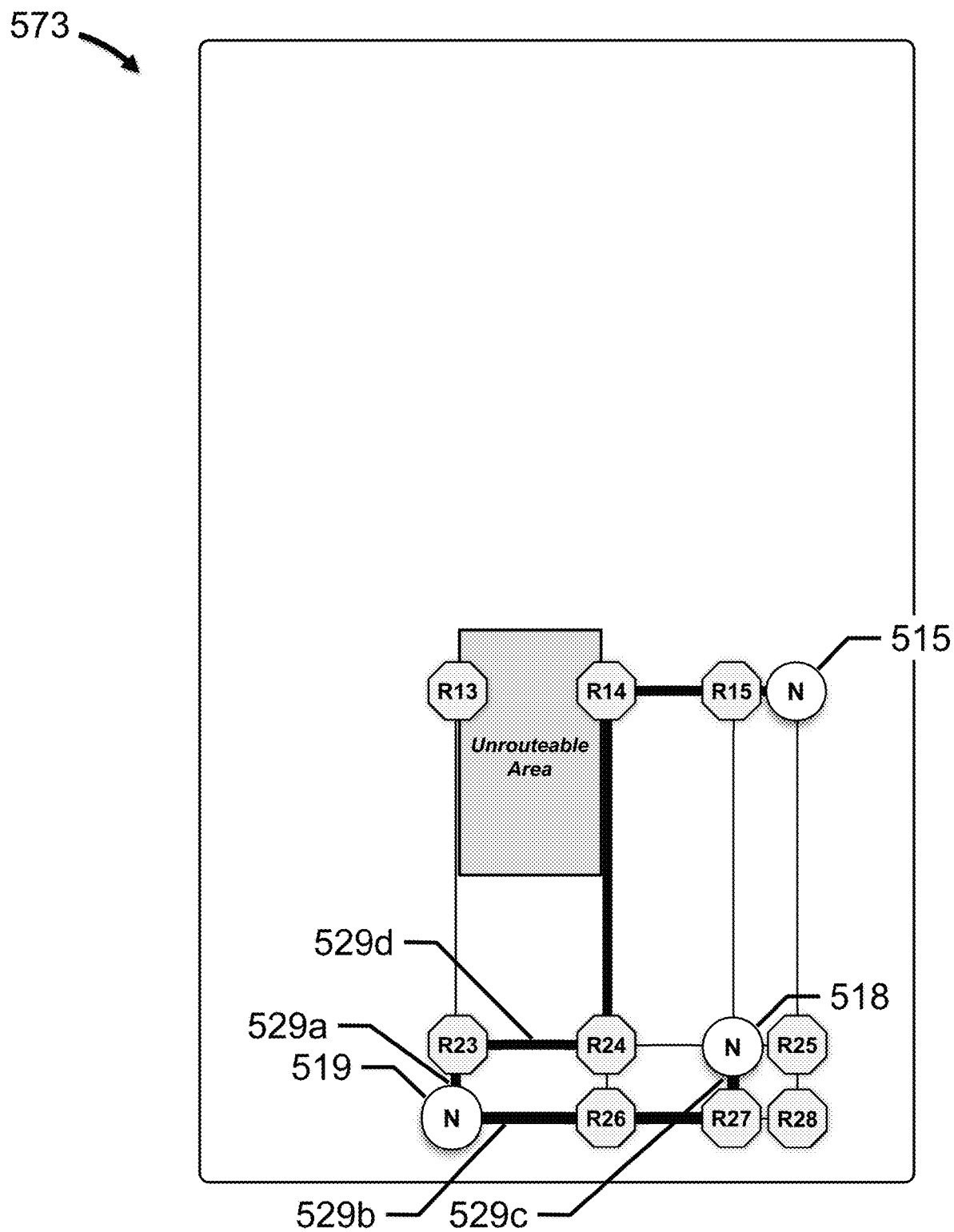

FIG. 9D depicts a weighted mesh or topology 573 for TG 560. The different weights for each connection are represented by different line thicknesses. The thinnest lines represent connections through which traffic does not flow. For example, edge 529 is associated with traffic flow set 329, which includes at least one traffic flow between node 518 (bridge port 318*a*) and node 519 (bridge port 319*a*). The rectilinear bounding box for traffic flow set 329 is defined by node 518 and node 519, represented by connections 529*a*, 529*b*, 529*c* and 529*d*. The weight for connections 529*a* and 529*d* are zero (i.e., no traffic flows; the line thicknesses represent the weights for edge 527), and the weight for connections 529*b* and 529*c* are thick.

A degree-constrained minimum-cost mesh or topology is then determined based on the weighted mesh or topology, including removing one or more connections and one or more routers. In one embodiment, a degree-constrained minimum-cost Steiner tree is determined, which generates a plurality of trees, based on the degree and the number of nodes, and then selects the lowest cost tree. The connections and routers through which traffic does not flow are then removed from the degree-constrained minimum-cost mesh or topology.

Figure 7E:
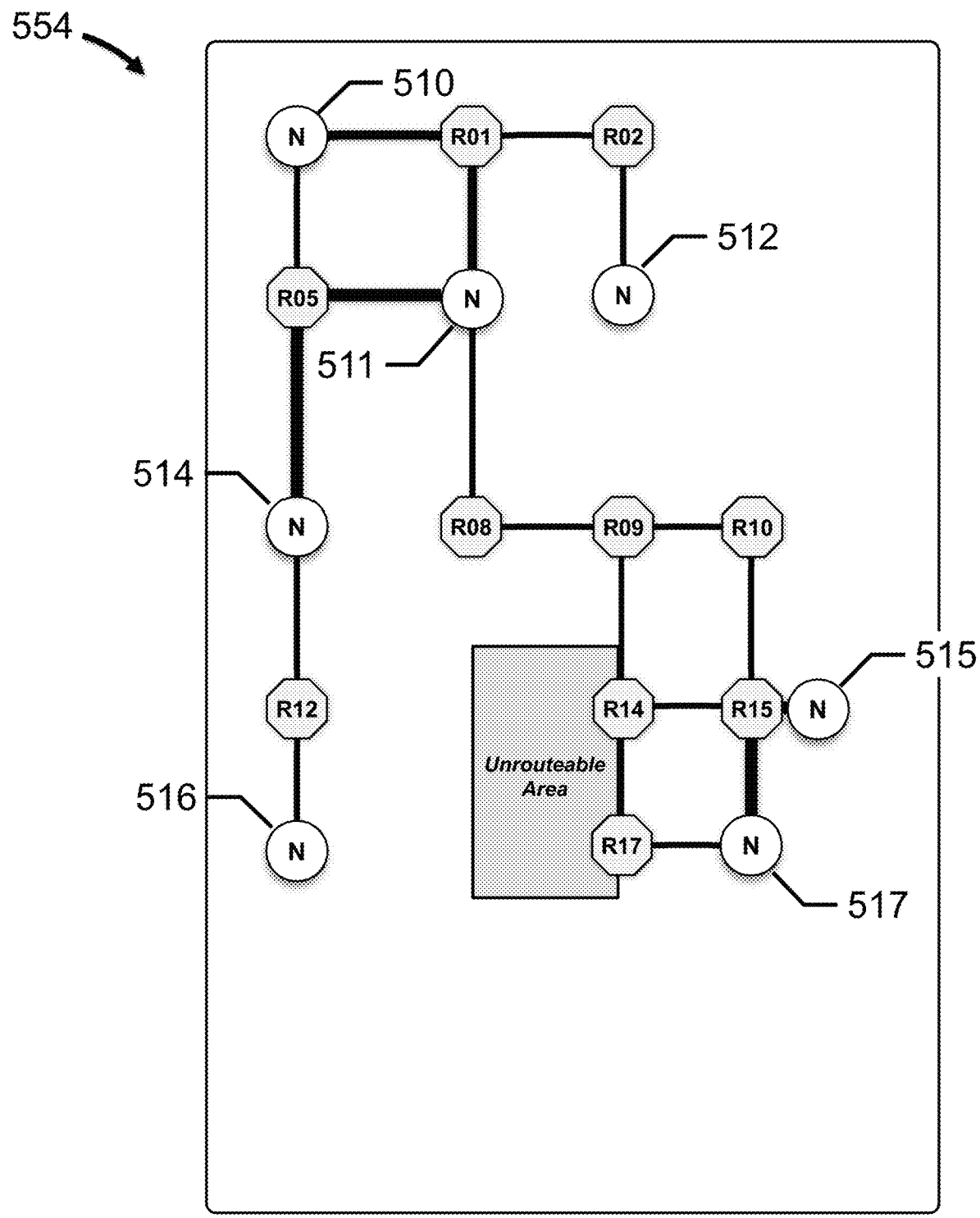

FIG. 7E depicts a degree-constrained minimum-cost mesh or topology 554 for TG 550. Degree-constrained minimum-cost topology 554 includes nodes 510 to 512 and 514 to 517, and routers R01, R02, R05, R08, R09, R10, R12, R14, R15 and R17. The connection weights are the same as FIG. 7D.

Node 510 is connected to routers R01 and R05, node 511 is connected to routers R01, R05 and R08, node 512 is connected to router R02, node 514 is connected to routers R05 and R12, node 515 is connected to router R15, node 516 is connected to router R12, node 517 is connected to routers R15 and R17.

Router R01 is connected to nodes 510, 511 and router R02, router R02 is connected to node 512 and router R01, router R05 is connected to nodes 510, 511 and 514, router R08 is connected to node 511 and router R09, router R09 is connected to routers R08, R10 and R14, router R10 is connected to routers R09 and R15, router R12 is connected to nodes 514 and 516, router R14 is connected to routers R09, R15 and R17, router R15 is connected to nodes 515, 517 and routers R10 and R14, router R17 is connected to node 517 and router R14.

Figure 8E:
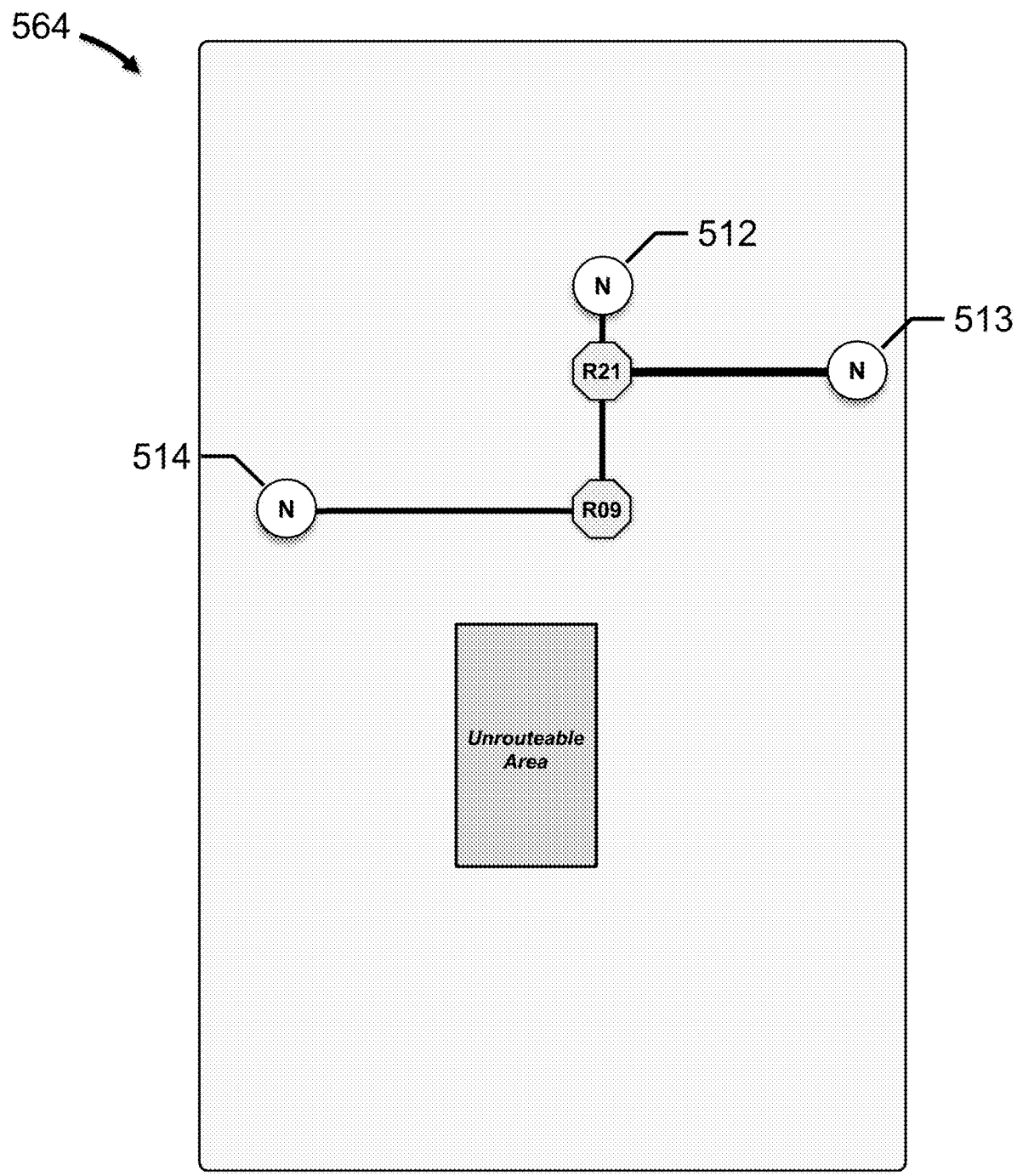

FIG. 8E depicts a degree-constrained minimum-cost mesh or topology 564 for TG 560. Node 512 is connected to router R29, node 513 is connected to router R29, and node 514 is connected to router R09. Router R29 is connected to nodes 512, 513 and router R09, and router R09 is connected to node 514 and router R29.

Figure 9E:
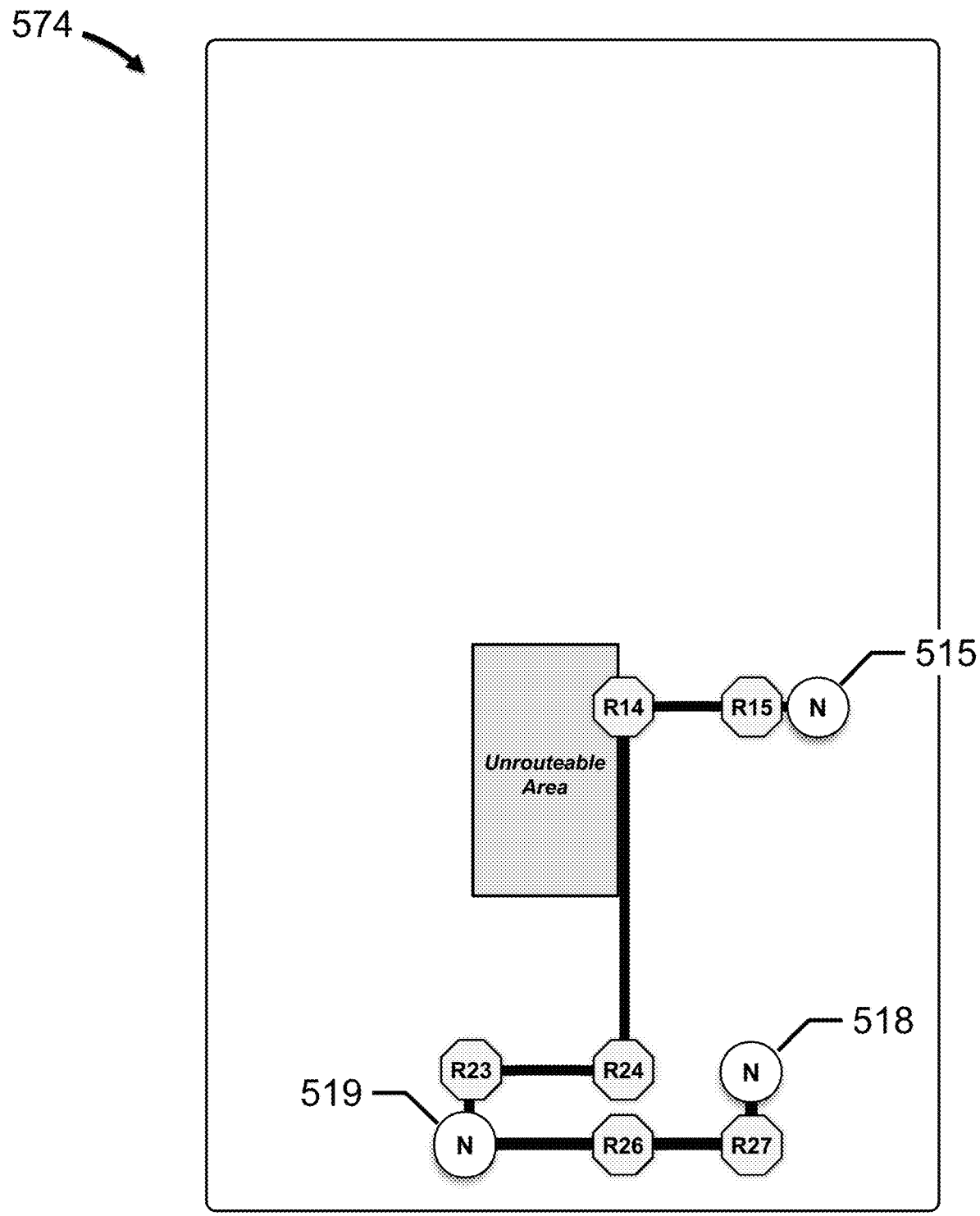

FIG. 9E depicts a degree-constrained minimum-cost mesh or topology 574 for TG 570. Node 515 is connected to router R15, node 518 is connected to router R27, and node 519 is connected to routers R23 and R26. Router R15 is connected to node 515 and router R14, router R14 is connected to routers R15 and R24, router R23 is connected to node 519 and router R24, router R24 is connected to routers R14 and R23, router R26 is connected to node 519 and router R27, and router R27 is connected to node 518 and router R26.

A candidate topology is then generated from the degree-constrained minimum-cost tree.

Figure 7F:
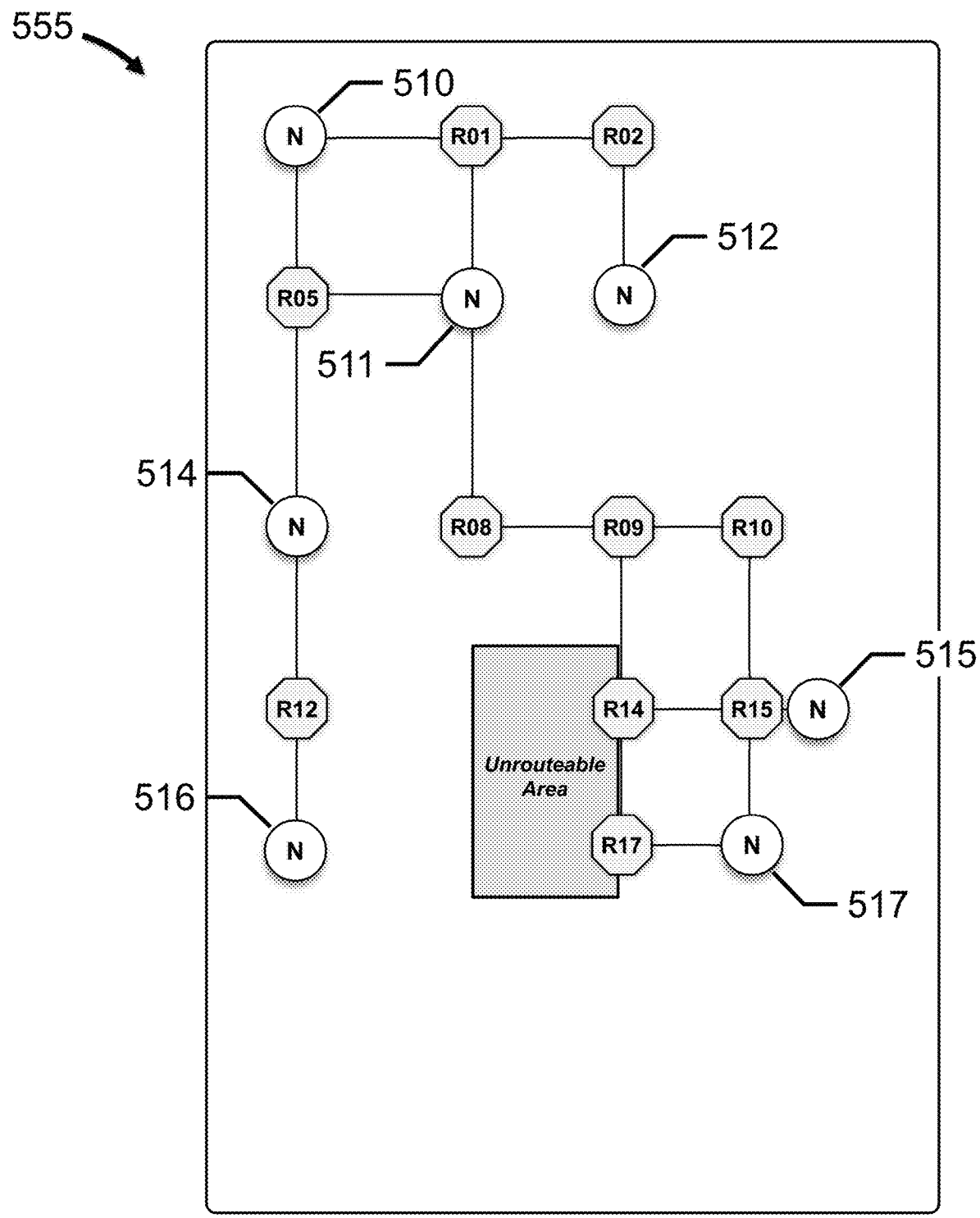

FIG. 7F depicts a candidate topology 555 for TG 550. Candidate topology 555 includes nodes 510, 511, 512 and 514 to 517, and routers R01, R02, R05, R08, R09, R10, R12, R14, R15 and R17. The connections between the nodes and the routers are the same as FIG. 7D.

Figure 8F:
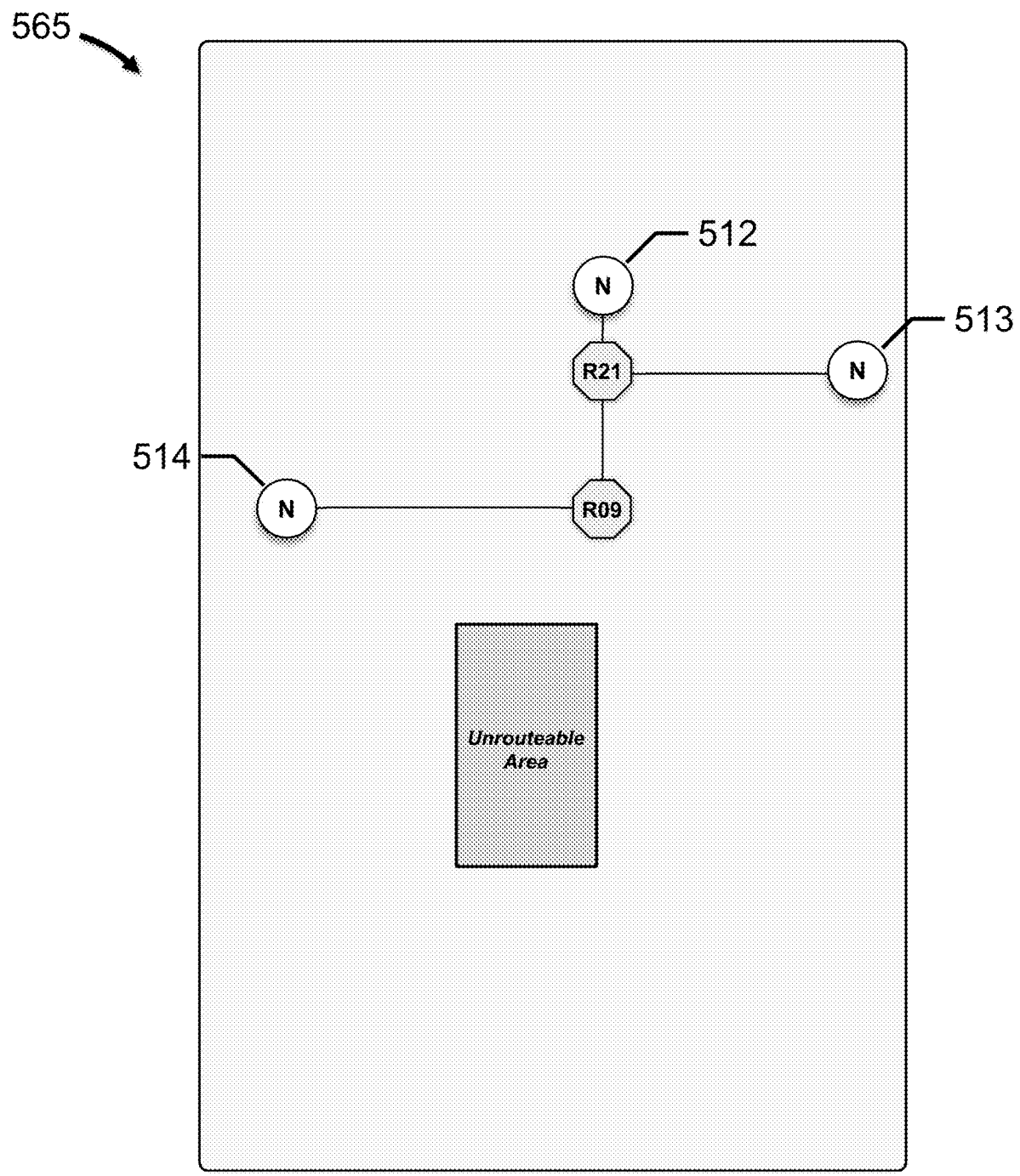

FIG. 8F depicts a candidate topology 565 for TG 560. Candidate topology 565 includes nodes 512, 513 and 514, and routers R09 and R29. The connections between the nodes and the routers are the same as FIG. 8D.

Figure 9F:
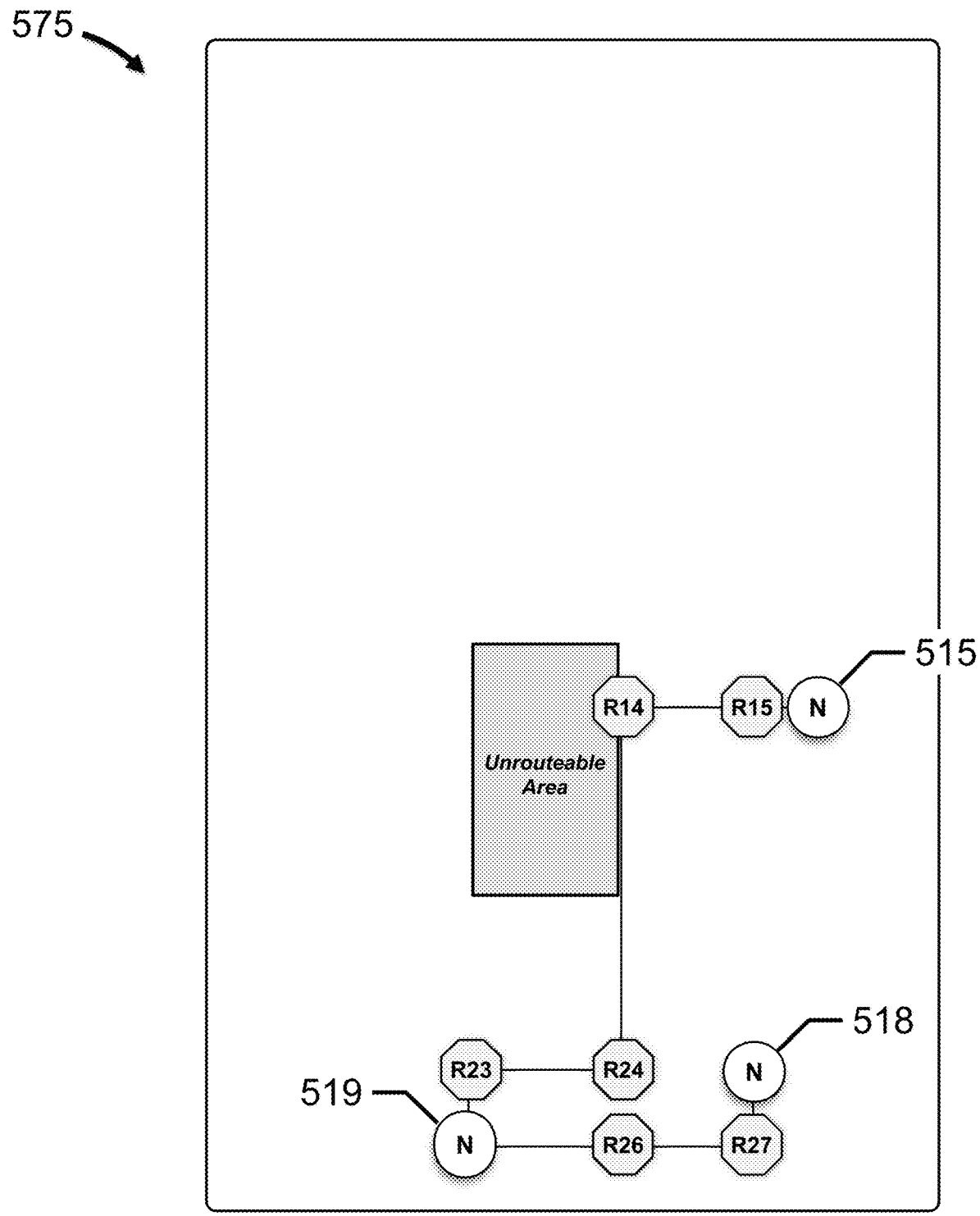

FIG. 9F depicts a candidate topology 575 for TG 570. Candidate topology 575 includes nodes 515, 518 and 519, and routers R14, R15, R23, R24, R26 and R27. The connections between the nodes and the routers are the same as FIG. 9D.

Generally, a user may view grids 551, 561 and 571, and topologies 552 to 555, 562 to 565 and 572 to 575 on display 152.

Referring back to FIG. 3, at 238, the candidate topologies are then merged to create a merged candidate topology, and the routers are merged within the merged candidate topology to generate the final topology.

Figure 10:
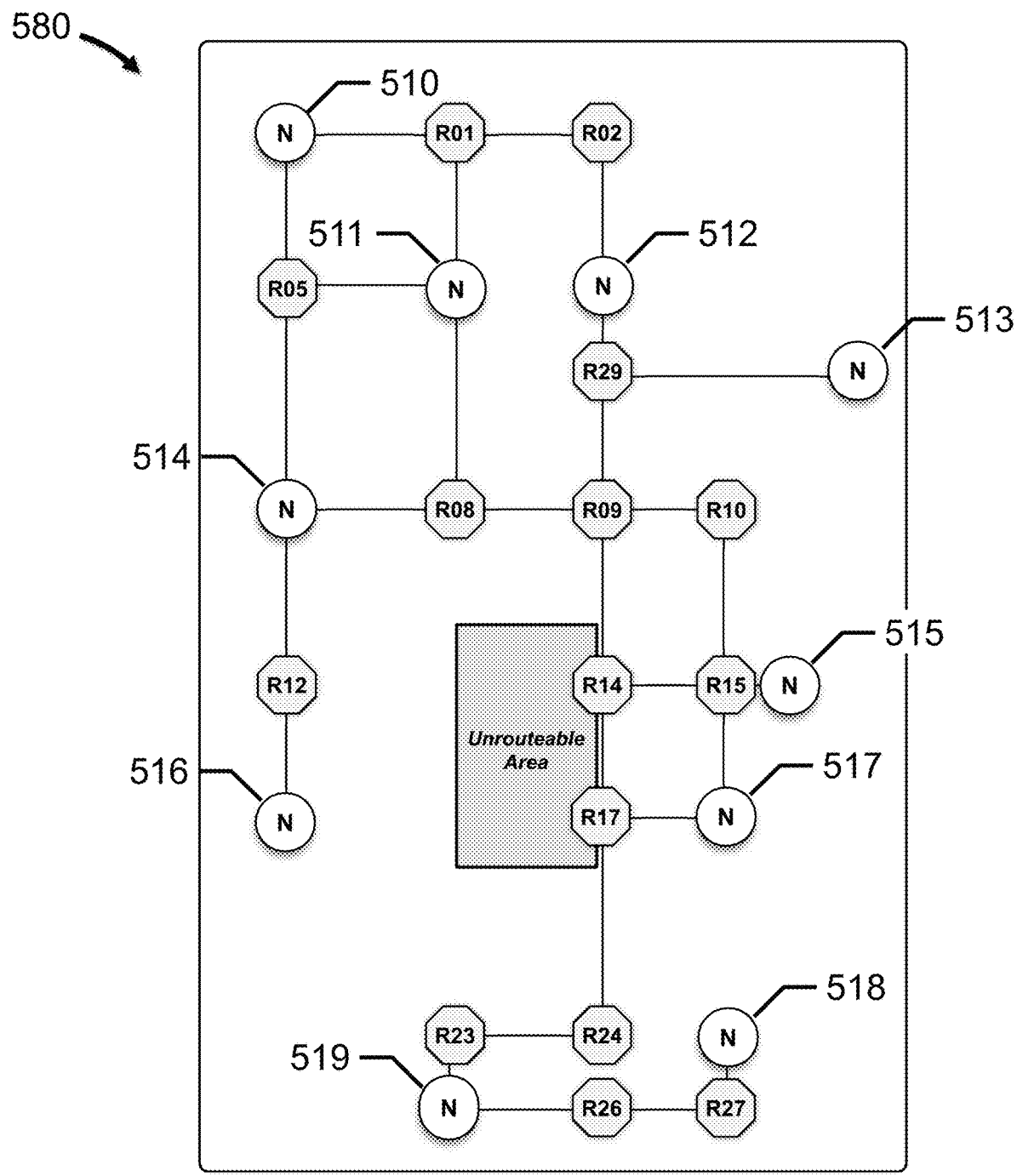
FIG. 10 depicts a merged candidate topology for a NoC, in accordance with an embodiment of the present disclosure.

FIG. 10 depicts a merged candidate topology 580 for NoC 300, in accordance with an embodiment of the present disclosure. Merged candidate topology 580 includes nodes 510 to 519, and routers R01, R02, R05, R08, R09, R10, R12, R14, R15, R17, R23, R24, R26 and R27.

Node 510 is connected to routers R01 and R05, node 511 is connected to routers R01, R05 and R08, node 512 is connected to routers R02 and R29, node 513 is connected to router R29, node 514 is connected to routers R05, R08 and R12, node 515 is connected to router R15, node 516 is connected to router R12, node 517 is connected to routers R15 and R17, node 518 is connected to router R27, and node 519 is connected to routers R23 and R26.

Router R01 is connected to nodes 510, 511 and router R02, router R02 is connected to node 512 and router R01, router R05 is connected to nodes 510, 511 and 514, router R08 is connected to nodes 511, 514 and router R09, router R09 is connected to routers R08, R10, R14 and R29, router R10 is connected to routers R09 and R15, router R12 is connected to nodes 514 and 516, router R14 is connected to routers R09, R15 and R17, router R15 is connected to nodes 515, 517 and routers R10 and R14, router R17 is connected to node 517 and routers R14 and R24, router R23 is connected to node 519 and router R24, router R24 is connected to routers R17 and R23, router R26 is connected to node 519 and router R27, and router R27 is connected to node 518 and router R26.

A user may view merged candidate topology 580 on display 152.

Figure 11:
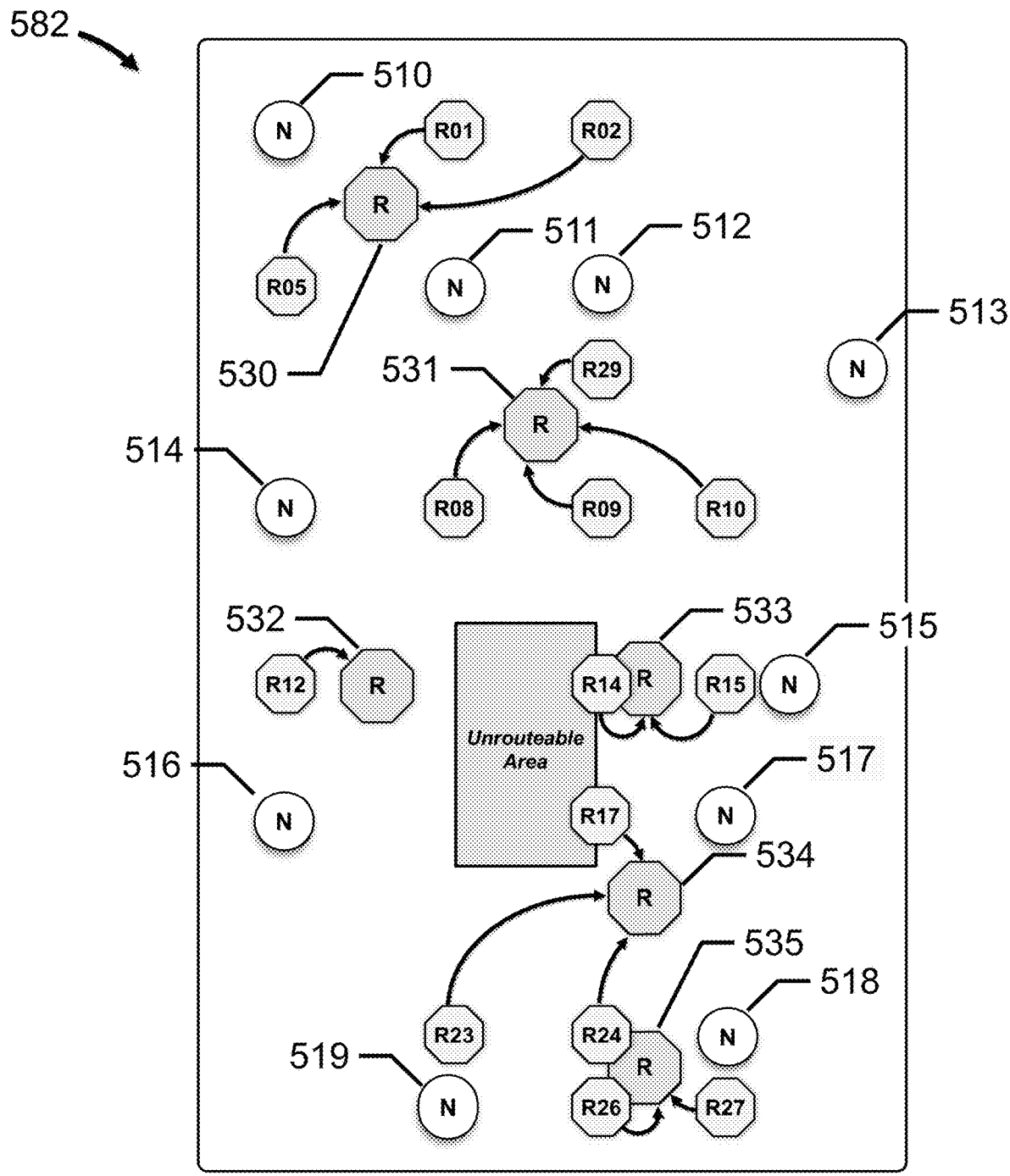
FIG. 11 depicts router merging for the merged candidate topology, in accordance with an embodiment of the present disclosure.

FIG. 11 depicts router merging for merged candidate topology 580, in accordance with an embodiment of the present disclosure. Router merging diagram 582 illustrates a process for merging routers in merged candidate topology 580. Generally, routing merging reduces the number of routers in the topology by merging or combining two or more routers into a single router. Merged routers may also be relocated, i.e., placed at a location that does not correspond to any of the grid locations of the original routers. Router relocation may occur after the candidate topologies for each color have been merged, and/or during a later optimization process.

Routers R01, R02 and R05 have been merged into router 530, which has been relocated. Routers R08, R09, R10 and R29 have been merged into router 531, which has been relocated. Router R12 has been relocated, and is now router 532. Routers R14 and R15 have been merged into router 533, which has been relocated. Routers R17, R23 and R24 have been merged into router 534, which has been relocated. Routers R26 and R27 have been merged into router 535, which has been relocated.

Figure 12:
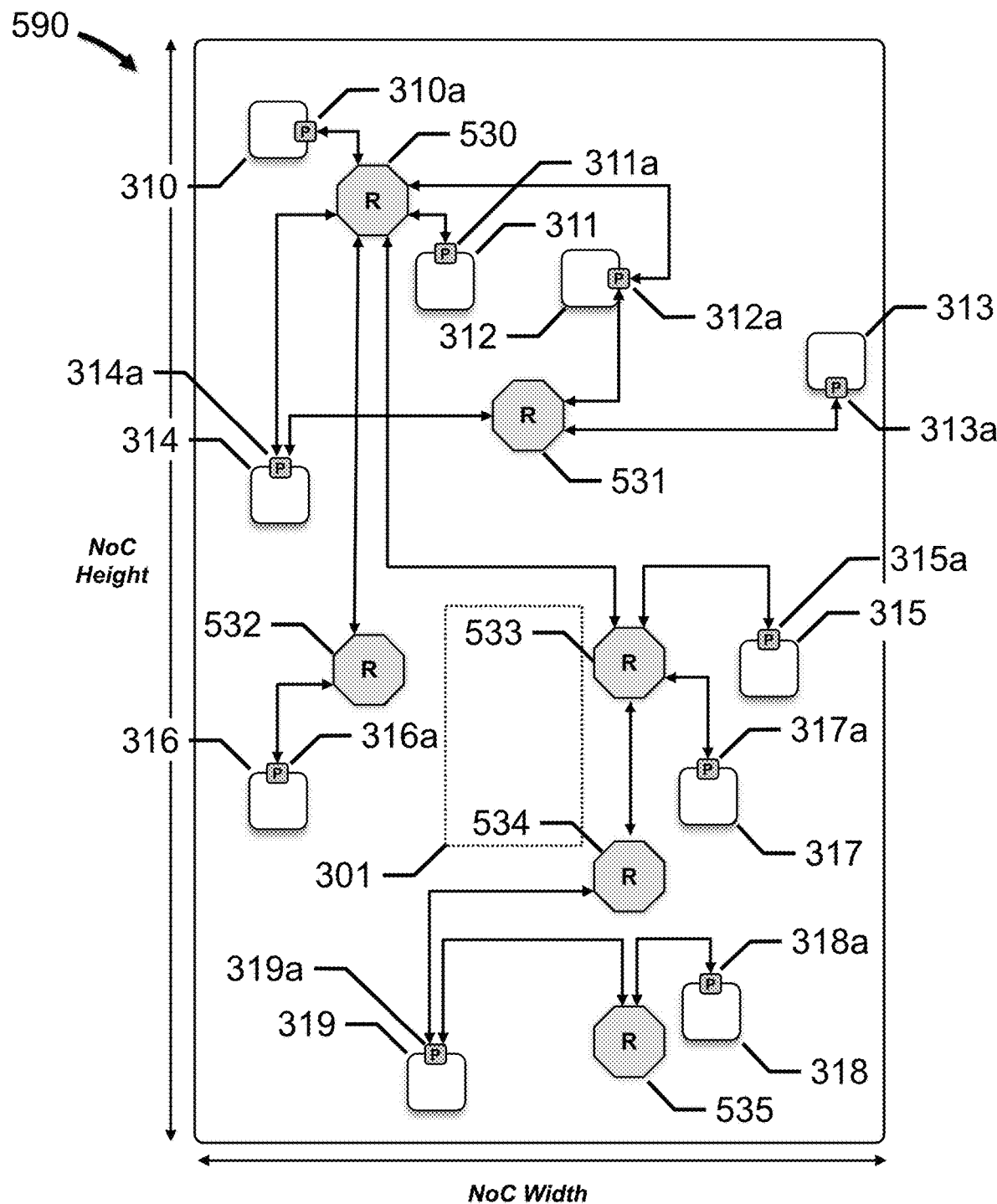
FIG. 12 depicts a final topology for a NoC, in accordance with an embodiment of the present disclosure.

FIG. 12 depicts final topology 590 for NoC 300, in accordance with an embodiment of the present disclosure. A user may view final topology 590 on display 152.

Final topology 590 has the same NoC height and width as NoC 300, and includes unrouteable area 301 located within a central portion of final topology 580. Device 310 is connected to router 530 through bridge port 310a. Device 311 is connected to router 531 through bridge port 311a. Device 312 is connected to routers 530 and 531 through bridge port 312a. Device 313 is connected to router 531 through bridge port 313a. Device 314 is connected to routers 530 and 531 through bridge port 314a. Device 315 is connected to router 533 through bridge port 315a. Device 316 is connected to router 532 through bridge port 316a. Device 317 is connected to router 533 through bridge port 317a. Device 318 is connected to router 535 through bridge port 318a. Device 319 is connected to routers 534 and 535 through bridge port 319a. Router 530 is connected to routers 532 and 533, and router 533 is connected to router 534.

Referring back to FIG. 2, at 240, a route for each traffic flow is determined. In one embodiment, shortest path routing is used, with optional constraints to disallow cycles in the generated topology. Different routing methodologies may be employed, such as, for example, XY-YX routing, turn prohibition routing, etc. In certain embodiments, clock domains may be determined and assigned based on traffic flows and topology.

At 250, a configuration/debug network is generated. The configuration/debug network includes the bridge ports, the routers, the connections and the routes. In one embodiment, the configuration/debug network mimics the data-network. Additionally, the configuration/debug network may be independently optimized in a manner similar to the data-network. The latency and performance of the configuration/debug network are typically relaxed in order to produce the simplest design with the lowest area.

At 260, a PCDC buffer is added to a connection between a bridge or router in a synchronous clock domain and an adjacent bridge or router in an asynchronous clock domain, and clock domains assignments may be refined.

At 270, a link size is determined for each router in each route, and a resizer is added between a bridge and a router with different link sizes or between adjacent routers with different link sizes. Generally, link sizes are determined using bridge data, traffic data, VC assignments and topology in order to collectively meet average traffic performance requirements and to individually meet peak traffic performance requirements. Additionally, the number of resizers added to the NoC is minimized in order to reduce the latency encountered by the traffic flows. In certain embodiments, certain bridge ports may be allowed to peak concurrently.

At 280, pipeline and retiming components are added based on timing. In order to meeting timing, pipeline components are added at appropriate locations to keep the slack (i.e., the difference between a required time and an arrival time) within appropriate limits. For example, one or more components may be relocated, and, if the relocated components are not able to meet timing, then one or more pipeline components may be added. For example, component relocation may be based on force-directed placement, etc.

At 290, NoC output specification 292 is generated, and then stored in memory 130. Additionally, NoC output specification 292 may be transmitted over network 20, provided to software modules 136 used by the NoC designer, etc. For example, NoC output specification 292 may be provided as input to a NoC fabrication process in a chip foundry. Reports 294 may also be generated, and then stored in memory 130. For example, reports 294 may contain the components used in the design (e.g., routers, resizers, PCDCs, pipelines, etc.), the traffic on each link, the link utilization, latencies across a path, etc.

Figure 13:
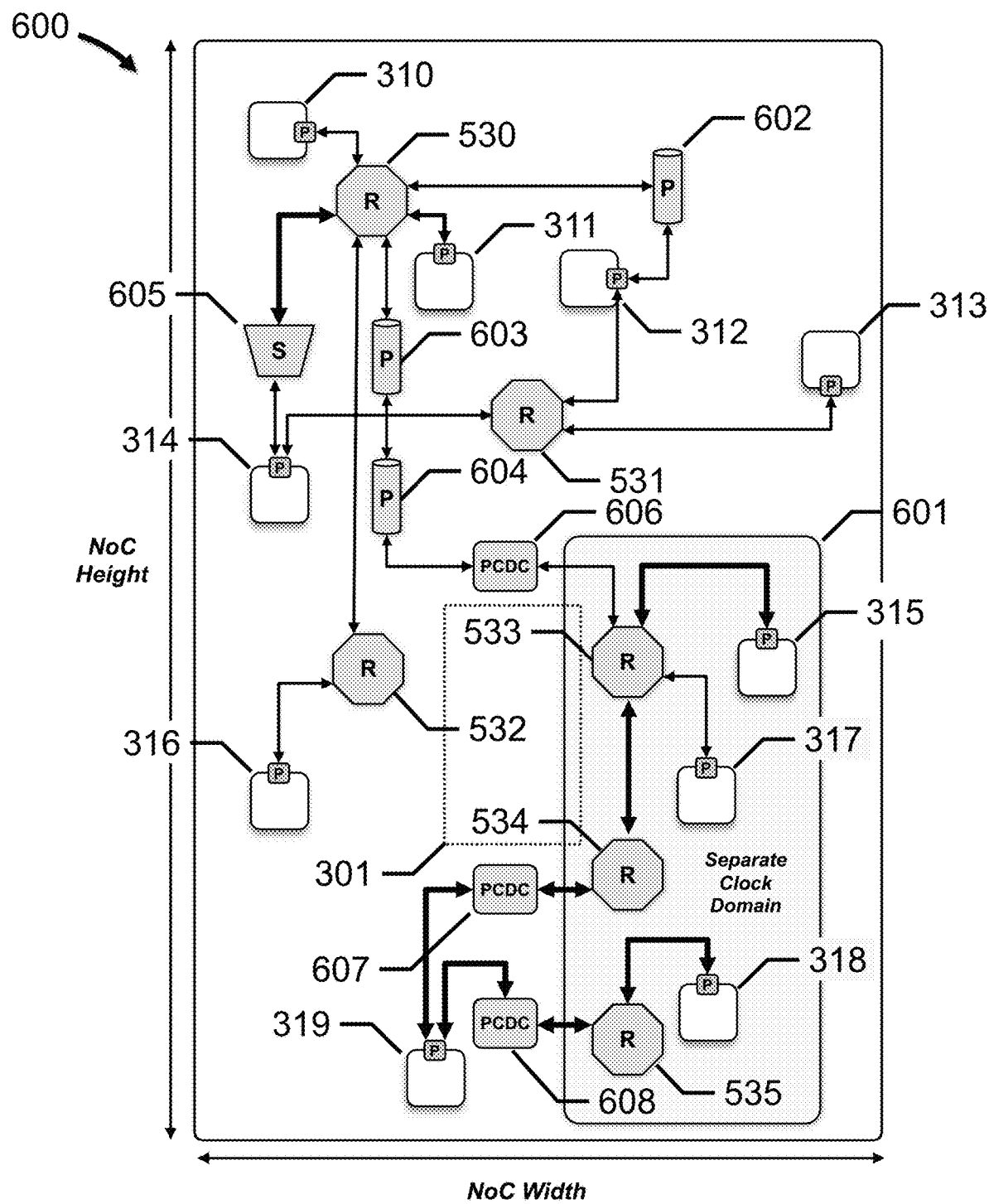
FIG. 13 depicts a graphical representation of an output specification for a NoC, in accordance with an embodiment of the present disclosure.

FIG. 13 depicts a graphical representation of NoC output specification 292, in accordance with an embodiment of the present disclosure. A user may view NoC 600 on display 152.

NoC 600 has the same NoC height and width as NoC 300, and includes unrouteable area 301 located within a central portion of NoC 600 and separate clock domain 601. Device 310 is connected to router 530. Device 311 is connected to router 530. Device 312 is connected to router 531 and to router 530 through pipeline 602. Device 313 is connected to router 531. Device 314 is connected to router 531 and to router 530 through resizer 605. Device 315 is connected to router 533. Device 316 is connected to router 532. Device 317 is connected to router 533. Device 318 is connected to router 535. Device 319 is connected to router 534 through PCDC buffer 607, and to router 535 through PCDC buffer 608. Router 530 is connected to router 532 and to router 533 through pipelines 603, 604 and PCDC buffer 606. Router 533 is connected to router 534.

Figure 14A:
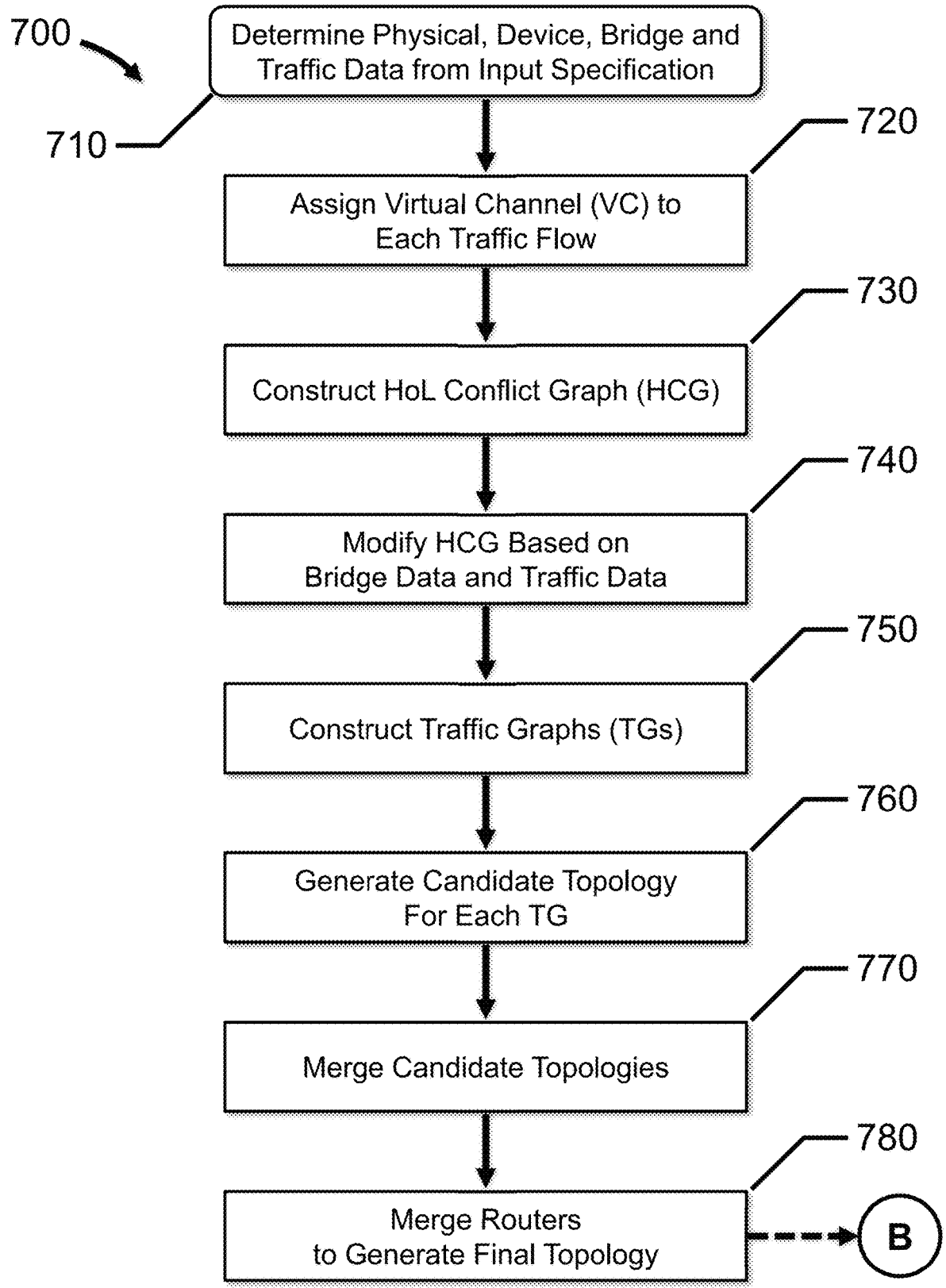
FIGS. 14A to 14C depict flow diagrams representing functionality associated with synthesizing a NoC, in accordance with an embodiment of the present disclosure.
Figure 14B:
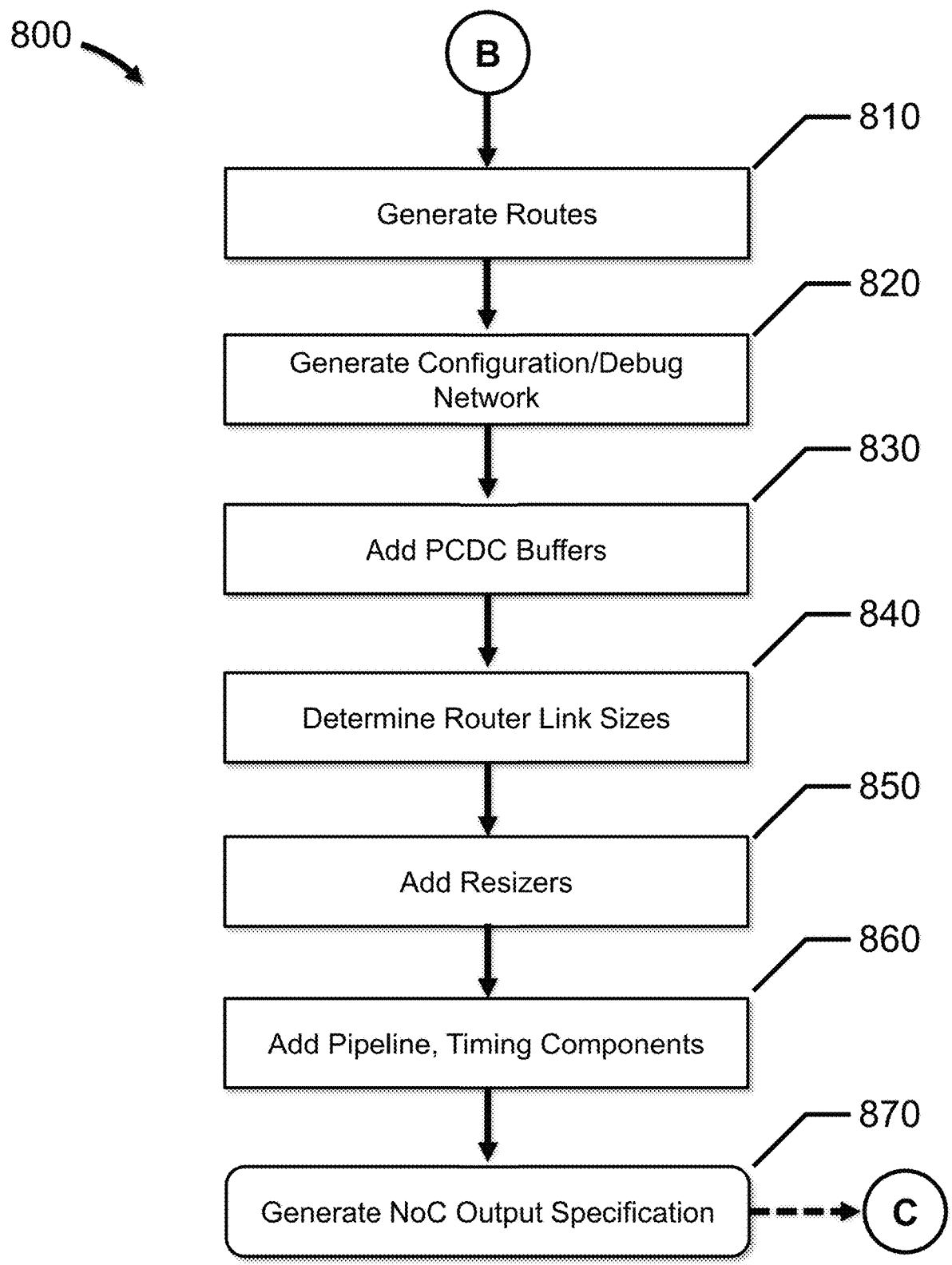
Figure 14C:
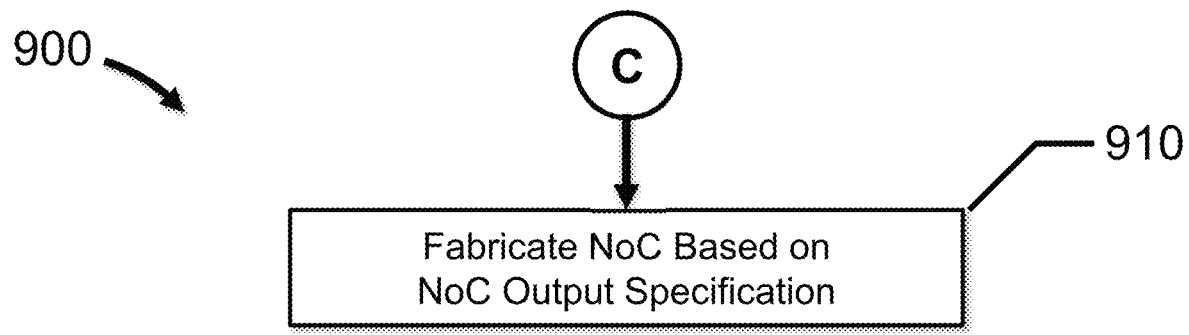

FIGS. 14A, 14B and 14C depict flow diagrams representing functionality associated with synthesizing a NoC, in accordance with embodiments of the present disclosure. FIG. 14A depicts flow diagram 700, FIG. 14B depicts flow diagram 800 and FIG. 14C depicts flow diagram 900.

At 710, physical data, device data, bridge data and traffic data are determined based on an input specification for the NoC. The bridge data include a plurality of bridge ports, and the traffic data include a plurality of traffic flows.

At 720, a VC is assigned to each traffic flow to create a plurality of VC assignments.

At 730 an HCG is constructed based on the traffic data and the VC assignments.

At 740, the HCG is modified based on the bridge data and the traffic data to generate a modified HCG.

At 750, a plurality of TGs are constructed based on the physical data, the bridge data, the traffic data and the modified HCG.

At 760, a candidate topology is generated for each TG. The candidate topology includes the plurality of bridge ports, a plurality of routers and a plurality of connections.

At 770, the candidate topologies are merged to create a merged candidate topology.

At 780, the routers within the merged candidate topology are merged to generate a final topology for the NoC.

At 810, a plurality of routes are generated based on the final topology and the traffic data. For each traffic flow, a route is generated from the source bridge port to the destination bridge port. Each route includes one or more routers disposed along a connection path between the source bridge port and the destination bridge port.

At 820, a configuration/debug network is generated. The configuration/debug network includes the bridge ports, the routers, the connections and the routes.

At 830, a PCDC buffer is added to a connection between a bridge or router in a synchronous clock domain and an adjacent bridge or router in an asynchronous clock domain.

At 840, a link size for each router in each route is determined.

At 850, a resizer is added between a bridge and a router with different link sizes or between adjacent routers with different link sizes.

At 860, pipeline and retiming components are added based on timing.

At 870, an output specification for the NoC is generated.

At 910, a NoC is fabricated based on NoC output specification 292.

Embodiments of the present disclosure advantageously provide a computer-based method and system for synthesizing a Network-on-Chip (NoC). The embodiments described above and summarized below are combinable.

In one embodiment, a method for synthesizing a Network-on-Chip (NoC) includes determining physical data, device data, bridge data and traffic data based on an input specification for the NoC, the bridge data including a plurality of bridge ports, and the traffic data including a plurality of traffic flows; assigning a virtual channel (VC) to each traffic flow to create a plurality of VC assignments; constructing a head of line (HoL) conflict graph (HCG) based on the traffic data and the VC assignments; modifying the HCG based on the bridge data and the traffic data to generate a modified HCG; constructing a plurality of traffic graphs (TGs) based on the physical data, the bridge data, the traffic data and the modified HCG; generating a candidate topology for each TG, the candidate topology including the plurality of bridge ports, a plurality of routers and a plurality of connections; merging the candidate topologies to create a merged candidate topology; and merging routers within the merged candidate topology to generate a final topology for the NoC.

In another embodiment of the method, constructing the HCG includes: creating a plurality of nodes, each node representing a traffic flow, creating a plurality of edges, each edge representing an HoL conflict, and assigning a color to each HCG node to minimize HoL conflicts; modifying the HCG includes re-assigning a new color to one or more HCG nodes and adding one or more new edges; and said constructing a plurality of TGs includes constructing a TG for each color of the modified HCG.

In another embodiment of the method, modifying the HCG includes creating a plurality of bins; calculating a link size for each bridge port based on the bridge data and the traffic data; and packing the bridge ports into the plurality of bins based on the bridge port link size to satisfy a maximum link size constraint.

In another embodiment of the method, each bin represents a different color; and each bin has a size that is a maximum link size.

In another embodiment of the method, the physical data include dimensions for the NoC; the device data include a plurality of devices, and each device has a location and dimensions; each bridge port is associated with one of the devices, and has a location and a data width; and each traffic flow includes a source bridge port, a destination bridge port, a peak traffic rate, an average traffic rate, and a traffic class, the source bridge port and the destination bridge port being included in the bridge data.

In another embodiment of the method, each traffic class includes a quality of service (QoS) and a latency sensitivity (LS); an HoL conflict is defined as two traffic flows with different traffic classes that are assigned to the same VC; and the HCG nodes are assigned a color to minimize the number of colors.

In another embodiment of the method, the TG includes a plurality of nodes and a plurality of edges that connect pairs of nodes; each node is associated with a different bridge port; each edge is associated with a set of traffic flows between two bridge ports; and each set of traffic flows includes at least one traffic flow.

In another embodiment of the method, generating the candidate topology includes: generating a grid based on the TG, the grid including a plurality of nodes and a plurality of intersections, where each node is located at a different intersection and is associated with a different bridge port; adding the plurality of routers to the grid, where each router is located at an intersection not occupied by a node; connecting adjacent nodes and routers to create an initial mesh having a plurality of connections; calculating a weight for each connection based on the traffic data to create a weighted mesh; determining a degree-constrained minimum-cost tree based on the weighted mesh, including removing one or more connections and one or more routers from the weighted mesh; and generating the candidate topology from the degree-constrained minimum-cost tree.

In another embodiment of the method, the method further includes generating a plurality of routes based on the final topology and the traffic data, including: for each traffic flow, generating a route from the source bridge port to the destination bridge port, each route including one or more routers disposed along a connection path between the source bridge port and the destination bridge port.

In another embodiment of the method, the method further includes generating a configuration/debug network including the bridge ports, the routers, the connections and the routes; adding a physical clock domain crossing (PCDC) buffer to a connection between a bridge or router in a synchronous clock domain and an adjacent bridge or router in an asynchronous clock domain; determining a link size for each router in each route; adding a resizer between a bridge and a router with different link sizes or between adjacent routers with different link sizes; adding pipeline and retiming components based on timing; and generating an output specification for the NoC.

In one embodiment, a method for synthesizing a Network-on-Chip (NoC) includes a storage element to store an input specification; and a processor, coupled to the storage element, configured to: determine physical data, device data, bridge data and traffic data based on an input specification for the NoC, the bridge data including a plurality of bridge ports, and the traffic data including a plurality of traffic flows, assign a virtual channel (VC) to each traffic flow to create a plurality of VC assignments, construct a head of line (HoL) conflict graph (HCG) based on the traffic data and the VC assignments, modify the HCG based on the bridge data and the traffic data to generate a modified HCG, construct a plurality of traffic graphs (TGs) based on the physical data, the bridge data, the traffic data and the modified HCG, generate a candidate topology for each TG, the candidate topology including the plurality of bridge ports, a plurality of routers and a plurality of connections, merge the candidate topologies to create a merged candidate topology, and merge routers within the merged candidate topology to generate a final topology for the NoC.

In another embodiment of the system, construct the HCG includes: create a plurality of nodes, each node representing a traffic flow, create a plurality of edges, each edge representing an HoL conflict, and assign a color to each HCG node to minimize HoL conflicts; modify the HCG includes re-assign a new color to one or more HCG nodes and add one or more new edges; and construct a plurality of TGs includes construct a TG for each color of the modified HCG.

In another embodiment of the system, modify the HCG includes: create a plurality of bins; calculate a link size for each bridge port based on the bridge data and the traffic data; and pack the bridge ports into the plurality of bins based on the bridge port link size to satisfy a maximum link size constraint.

In another embodiment of the system, each bin represents a different color; and each bin has a size that is a maximum link size.

In another embodiment of the system, the physical data include dimensions for the NoC; the device data include a plurality of devices, and each device has a location and dimensions; each bridge port is associated with one of the devices, and has a location and a data width; and each traffic flow includes a source bridge port, a destination bridge port, a peak traffic rate, an average traffic rate, and a traffic class, the source bridge port and the destination bridge port being included in the bridge data.

In another embodiment of the system, each traffic class includes a quality of service (QoS) and a latency sensitivity (LS); an HoL conflict is defined as two traffic flows with different traffic classes that are assigned to the same VC; and the HCG nodes are assigned a color to minimize the number of colors.

In another embodiment of the system, the TG includes a plurality of nodes and a plurality of edges that connect pairs of nodes; each node is associated with a different bridge port; each edge is associated with a set of traffic flows between two bridge ports; and each set of traffic flows includes at least one traffic flow.

In another embodiment of the system, generate the candidate topology includes: generate a grid based on the TG, the grid including a plurality of nodes and a plurality of intersections, where each node is located at a different intersection and is associated with a different bridge port; add the plurality of routers to the grid, where each router is located at an intersection not occupied by a node; connect adjacent nodes and routers to create an initial mesh having a plurality of connections; calculate a weight for each connection based on the traffic data to create a weighted mesh; determine a degree-constrained minimum-cost tree based on the weighted mesh, including removing one or more connections and one or more routers from the weighted mesh; and generate the candidate topology from the degree-constrained minimum-cost tree.

In another embodiment of the system, the processor is further configured to: generate a plurality of routes based on the final topology and the traffic data, including: for each traffic flow, generating a route from the source bridge port to the destination bridge port, each route including one or more routers disposed along a connection path between the source bridge port and the destination bridge port.

In another embodiment of the system, the processor is further configured to: generate a configuration/debug network including the bridge ports, the routers, the connections and the routes; add a physical clock domain crossing (PCDC) buffer to a connection between a bridge or router in a synchronous clock domain and an adjacent bridge or router in an asynchronous clock domain; determine a link size for each router in each route; add a resizer between a bridge and a router with different link sizes or between adjacent routers with different link sizes; add pipeline and retiming components based on timing; and generate an output specification for the NoC.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A computer-based method for synthesizing a Network-on-Chip (NoC), comprising:
   determining physical data, device data, bridge data and traffic data based on an input specification for the NoC, the bridge data including a plurality of bridge ports, and the traffic data including a plurality of traffic flows;
   assigning a virtual channel (VC) to each traffic flow to create a plurality of VC assignments;
   constructing a head of line (HoL) conflict graph (HCG) based on the traffic data and the VC assignments;
   modifying the HCG based on the bridge data and the traffic data to generate a modified HCG;
   constructing a plurality of traffic graphs (TGs) based on the physical data, the bridge data, the traffic data and the modified HCG;
   generating a candidate topology for each TG, the candidate topology including the plurality of bridge ports, a plurality of routers and a plurality of connections;
   merging the candidate topologies to create a merged candidate topology; and
   merging routers within the merged candidate topology to generate a final topology for the NoC.

2. The computer-based method according to claim 1, where:
   said constructing the HCG includes:
      creating a plurality of nodes, each node representing a traffic flow,
      creating a plurality of edges, each edge representing an HoL conflict, and
      assigning a color to each HCG node to minimize HoL conflicts;
   said modifying the HCG includes re-assigning a new color to one or more HCG nodes and adding one or more new edges; and
   said constructing a plurality of TGs includes constructing a TG for each color of the modified HCG.

3. The computer-based method according to claim 2, where said modifying the HCG includes:
   creating a plurality of bins;
   calculating a link size for each bridge port based on the bridge data and the traffic data; and
   packing the bridge ports into the plurality of bins based on the bridge port link size to satisfy a maximum link size constraint.

4. The computer-based method according to claim 3, where:
   each bin represents a different color; and
   each bin has a size that is a maximum link size.

5. The computer-based method according to claim 1, where:
   the physical data include dimensions for the NoC;
   the device data include a plurality of devices, and each device has a location and dimensions;
   each bridge port is associated with one of the devices, and has a location and a data width; and
   each traffic flow includes a source bridge port, a destination bridge port, a peak traffic rate, an average traffic rate, and a traffic class, the source bridge port and the destination bridge port being included in the bridge data.

6. The computer-based method according to claim 5, where:
   each traffic class includes a quality of service (QoS) and a latency sensitivity (LS);
   an HoL conflict is defined as two traffic flows with different traffic classes that are assigned to the same VC; and
   the HCG nodes are assigned a color to minimize the number of colors.

7. The computer-based method according to claim 6, where:
   the TG includes a plurality of nodes and a plurality of edges that connect pairs of nodes;
   each node is associated with a different bridge port;
   each edge is associated with a set of traffic flows between two bridge ports; and
   each set of traffic flows includes at least one traffic flow.

8. The computer-based method according to claim 7, where said generating the candidate topology includes:
   generating a grid based on the TG, the grid including a plurality of nodes and a plurality of intersections, where each node is located at a different intersection and is associated with a different bridge port;
   adding the plurality of routers to the grid, where each router is located at an intersection not occupied by a node;
   connecting adjacent nodes and routers to create an initial mesh having a plurality of connections;
   calculating a weight for each connection based on the traffic data to create a weighted mesh;
   determining a degree-constrained minimum-cost tree based on the weighted mesh, including removing one or more connections and one or more routers from the weighted mesh; and
   generating the candidate topology from the degree-constrained minimum-cost tree.

9. The computer-based method according to claim 8, further comprising:
   generating a plurality of routes based on the final topology and the traffic data, including:
      for each traffic flow, generating a route from the source bridge port to the destination bridge port, each route including one or more routers disposed along a connection path between the source bridge port and the destination bridge port.

10. The computer-based method according to claim 9, further comprising:
    generating a configuration/debug network including the bridge ports, the routers, the connections and the routes;
    adding a physical clock domain crossing (PCDC) buffer to a connection between a bridge or router in a synchronous clock domain and an adjacent bridge or router in an asynchronous clock domain;
    determining a link size for each router in each route;
    adding a resizer between a bridge and a router with different link sizes or between adjacent routers with different link sizes;
    adding pipeline and retiming components based on timing; and
    generating an output specification for the NoC.

11. A system for synthesizing a Network-on-Chip (NoC), comprising:
    a storage element to store an input specification; and
    a processor, coupled to the storage element, configured to:
       determine physical data, device data, bridge data and traffic data based on an input specification for the NoC, the bridge data including a plurality of bridge ports, and the traffic data including a plurality of traffic flows, assign a virtual channel (VC) to each traffic flow to create a plurality of VC assignments, construct a head of line (HoL) conflict graph (HCG) based on the traffic data and the VC assignments, modify the HCG based on the bridge data and the traffic data to generate a modified HCG, construct a plurality of traffic graphs (TGs) based on the physical data, the bridge data, the traffic data and the modified HCG, generate a candidate topology for each TG, the candidate topology including the plurality of bridge ports, a plurality of routers and a plurality of connections, merge the candidate topologies to create a merged candidate topology, and merge routers within the merged candidate topology to generate a final topology for the NoC.

12. The system according to claim 11, where:
said construct the HCG includes:
create a plurality of nodes, each node representing a traffic flow,
create a plurality of edges, each edge representing an HoL conflict, and
assign a color to each HCG node to minimize HoL conflicts;
said modify the HCG includes re-assign a new color to one or more HCG nodes and add one or more new edges; and
said construct a plurality of TGs includes construct a TG for each color of the modified HCG.

13. The system according to claim 12, where said modify the HCG includes:
create a plurality of bins;
calculate a link size for each bridge port based on the bridge data and the traffic data; and
pack the bridge ports into the plurality of bins based on the bridge port link size to satisfy a maximum link size constraint.

14. The system according to claim 13, where:
each bin represents a different color; and
each bin has a size that is a maximum link size.

15. The system according to claim 11, where:
the physical data include dimensions for the NoC;
the device data include a plurality of devices, and each device has a location and dimensions;
each bridge port is associated with one of the devices, and has a location and a data width; and
each traffic flow includes a source bridge port, a destination bridge port, a peak traffic rate, an average traffic rate, and a traffic class, the source bridge port and the destination bridge port being included in the bridge data.

16. The system according to claim 15, where:
each traffic class includes a quality of service (QoS) and a latency sensitivity (LS);

an HoL conflict is defined as two traffic flows with different traffic classes that are assigned to the same VC; and
the HCG nodes are assigned a color to minimize the number of colors.

17. The system according to claim 16, where:
the TG includes a plurality of nodes and a plurality of edges that connect pairs of nodes;
each node is associated with a different bridge port;
each edge is associated with a set of traffic flows between two bridge ports; and
each set of traffic flows includes at least one traffic flow.

18. The system according to claim 17, where said generate the candidate topology includes:
generate a grid based on the TG, the grid including a plurality of nodes and a plurality of intersections, where each node is located at a different intersection and is associated with a different bridge port;
add the plurality of routers to the grid, where each router is located at an intersection not occupied by a node;
connect adjacent nodes and routers to create an initial mesh having a plurality of connections;
calculate a weight for each connection based on the traffic data to create a weighted mesh;
determine a degree-constrained minimum-cost tree based on the weighted mesh, including removing one or more connections and one or more routers from the weighted mesh; and
generate the candidate topology from the degree-constrained minimum-cost tree.

19. The system according to claim 18, where the processor is further configured to:
generate a plurality of routes based on the final topology and the traffic data, including:
for each traffic flow, generating a route from the source bridge port to the destination bridge port, each route including one or more routers disposed along a connection path between the source bridge port and the destination bridge port.

20. The system according to claim 19, where the processor is further configured to:
generate a configuration/debug network including the bridge ports, the routers, the connections and the routes;
add a physical clock domain crossing (PCDC) buffer to a connection between a bridge or router in a synchronous clock domain and an adjacent bridge or router in an asynchronous clock domain;
determine a link size for each router in each route;
add a resizer between a bridge and a router with different link sizes or between adjacent routers with different link sizes;
add pipeline and retiming components based on timing; and
generate an output specification for the NoC.

* * * * *